(12) United States Patent
Choi

(10) Patent No.: US 11,217,671 B2
(45) Date of Patent: Jan. 4, 2022

(54) SEMICONDUCTOR DEVICE AND MANUFACTURING METHOD THEREOF

(71) Applicant: SK hynix Inc., Icheon-si (KR)

(72) Inventor: Kang Sik Choi, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 32 days.

(21) Appl. No.: 16/812,091

(22) Filed: Mar. 6, 2020

(65) Prior Publication Data

US 2020/0212187 A1 Jul. 2, 2020

Related U.S. Application Data

(63) Continuation of application No. 16/189,466, filed on Nov. 13, 2018, now Pat. No. 10,629,691.

(30) Foreign Application Priority Data

Apr. 3, 2018 (KR) .......................... 10-2018-0038838

(51) Int. Cl.
| | |
|---|---|
| *H01L 27/11514* | (2017.01) |
| *H01L 29/417* | (2006.01) |
| *H01L 29/423* | (2006.01) |
| *H01L 29/10* | (2006.01) |
| *H01L 27/11582* | (2017.01) |

(52) U.S. Cl.
CPC .. *H01L 29/41741* (2013.01); *H01L 27/11582* (2013.01); *H01L 29/1037* (2013.01); *H01L 29/4234* (2013.01)

(58) Field of Classification Search
CPC ......... H01L 27/11273; H01L 27/11514; H01L 27/1158; H01L 27/11578
See application file for complete search history.

(56) References Cited

U.S. PATENT DOCUMENTS

| | | | |
|---|---|---|---|
| 9,355,727 B1 | 5/2016 | Zhang et al. | |
| 9,437,606 B2 | 9/2016 | Makala et al. | |
| 2007/0029607 A1 | 2/2007 | Kouznetzov | |
| 2010/0159657 A1 | 6/2010 | Arai et al. | |
| 2011/0180941 A1 | 7/2011 | Hwang et al. | |
| 2013/0134492 A1 | 5/2013 | Yang et al. | |
| 2014/0329379 A1 | 11/2014 | Kim et al. | |
| 2016/0043100 A1 | 2/2016 | Lee et al. | |
| 2016/0163686 A1 | 6/2016 | Lee et al. | |

(Continued)

FOREIGN PATENT DOCUMENTS

| | | |
|---|---|---|
| KR | 1020120041314 A | 5/2012 |
| KR | 1020160001408 A | 1/2016 |
| KR | 1020190008676 A | 1/2019 |

*Primary Examiner* — Jae Lee
(74) *Attorney, Agent, or Firm* — William Park & Associates Ltd.

(57) ABSTRACT

A semiconductor device and manufacturing method includes a well structure, a gate stack structure spaced apart from the well structure, the gate stack structure being disposed over the well structure, and a source contact structure facing a sidewall of the gate stack structure. The semiconductor device further includes a channel pattern having pillar parts penetrating the gate stack structure, a first connecting part extending along a bottom surface of the gate stack structure from the pillar parts, and a second connecting part extending from the first connecting part to contact a first surface of the source contact structure facing the well structure.

17 Claims, 36 Drawing Sheets

(56) References Cited

U.S. PATENT DOCUMENTS

| | | |
|---|---|---|
| 2016/0225754 A1 | 8/2016 | Jang |
| 2016/0247817 A1 | 8/2016 | Lee et al. |
| 2016/0293625 A1 | 10/2016 | Kang et al. |
| 2017/0179148 A1 | 6/2017 | Kwon et al. |
| 2017/0221756 A1 | 8/2017 | Tsutsumi et al. |
| 2018/0053768 A1 | 2/2018 | Kim et al. |
| 2018/0108672 A1 | 4/2018 | Choi et al. |
| 2018/0145087 A1 | 5/2018 | Kwon et al. |
| 2018/0308856 A1* | 10/2018 | Cho .................. H01L 27/11565 |
| 2019/0019808 A1 | 1/2019 | Choi |
| 2020/0027893 A1 | 1/2020 | Yang et al. |
| 2020/0176467 A1 | 6/2020 | Choi et al. |
| 2020/0243546 A1 | 7/2020 | Lee |

\* cited by examiner

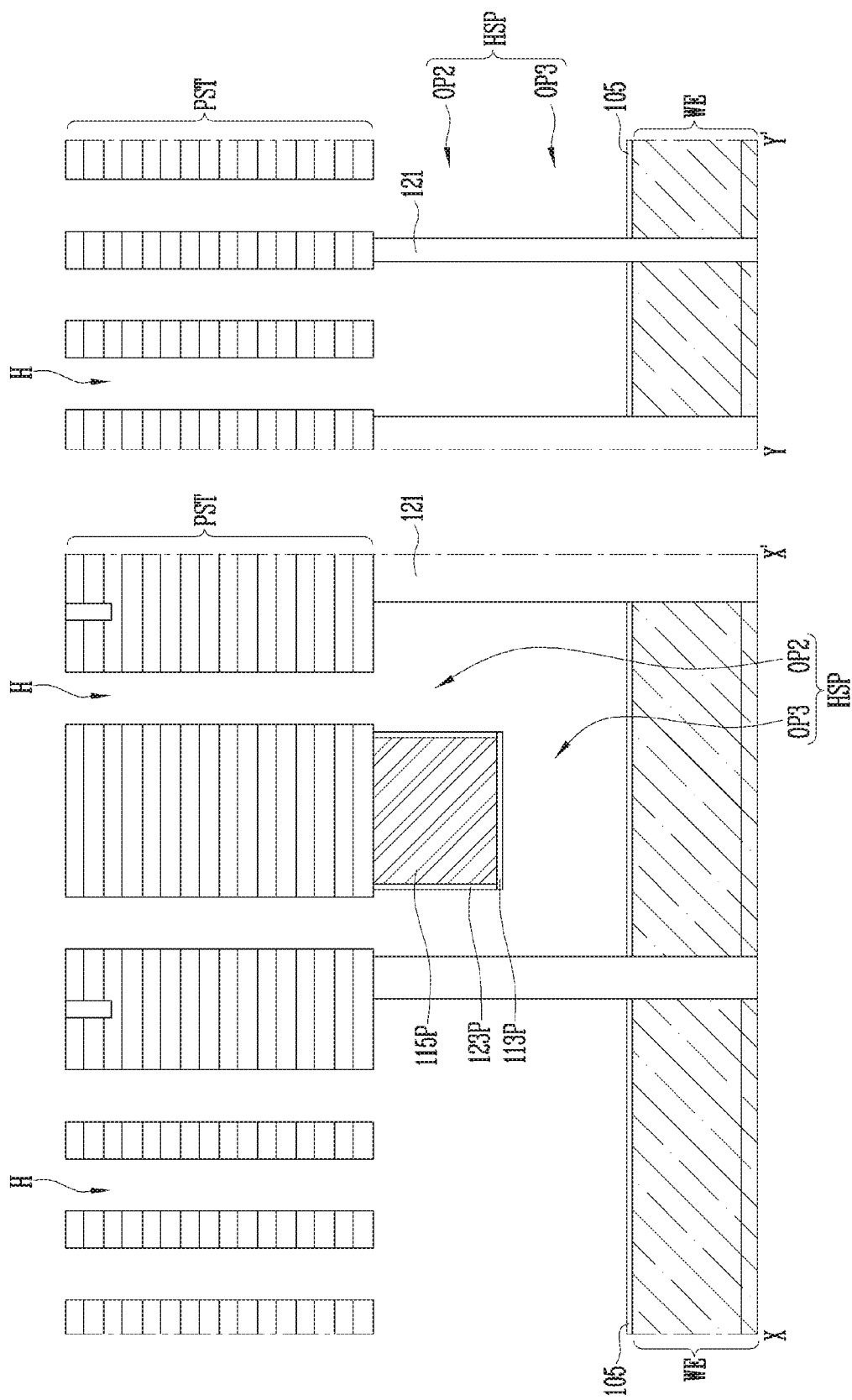

SEMICONDUCTOR DEVICE AND MANUFACTURING METHOD THEREOF

CROSS-REFERENCE TO RELATED APPLICATION

The present application is a continuation application of U.S. patent application Ser. No. 16/189,466, filed on Nov. 13, 2018, and claims priority under 35 U.S.C. § 119(a) to Korean patent application number 10-2018-0038838 filed on Apr. 3, 2018, in the Korean Intellectual Property Office, the entire disclosure of which is incorporated herein by reference.

BACKGROUND

1. Technical Field

The present disclosure may generally relate to a semiconductor device and a manufacturing method thereof, and more particularly, to a three-dimensional semiconductor device and a manufacturing method thereof.

2. Related Art

A semiconductor device includes a plurality of memory cell transistors capable of storing data. The memory cell transistors may be connected in series between select transistors to constitute a memory string. A three-dimensional semiconductor device has been proposed in order to achieve a high degree of integration for semiconductor devices. Gate patterns of memory cell transistors and select transistors may be stacked on each other to form a three-dimensional semiconductor device. For implementing such a three-dimensional semiconductor device, various techniques for improving the operational reliability of the semiconductor device have been developed.

SUMMARY

In accordance with an embodiment, a semiconductor device includes: a well structure; a gate stack structure spaced apart from the well structure, the gate stack structure disposed over the well structure; a source contact structure facing a sidewall of the gate stack structure; and a channel pattern. The channel pattern includes pillar parts penetrating the gate stack structure, a first connecting part extending along a bottom surface of the gate stack structure from the pillar parts, and a second connecting part extending from the first connecting part to contact a first surface of the source contact structure facing the well structure.

In accordance with another embodiment, a semiconductor device includes: a well structure including a dopant of a first conductivity type; a stack structure disposed above the well structure and spaced apart from the well structure; supports providing support between the stack structure and the well structure; a slit penetrating the stack structure, the slit separating the stack structure into a first gate stack structure and a second gate stack structure; spacer insulating layers formed on sidewalls of the slit to cover sidewalls of the first gate stack structure and the second gate stack structure; a source contact structure including first source contact patterns that are formed on the spacer insulating layers, protrude farther toward the well structure than the spacer insulating layers, and include a dopant of a second conductivity type, and a second source contact pattern that fills in the slit between the first source contact patterns and protrudes farther toward the well structure than the first source contact patterns; and channel patterns extending along sidewalls of the supports, along a bottom surface of the stack structure, and along bottom surfaces of the first source contact patterns facing the well structure, the channel patterns being separated by the second source contact pattern.

In accordance with an embodiment, a method of manufacturing a semiconductor device includes: forming an opening region comprising a horizontal space and holes, wherein the horizontal space is defined between a well structure and a stack structure and is maintained by supports disposed under the stack structure, and wherein the holes extend to penetrate the stack structure from the horizontal space; forming a multi-layered memory layer extending along a surface of the opening region and surfaces of the supports; forming a channel layer on the multi-layered memory layer; forming a gap fill insulating layer filling the opening region inside the multi-layered memory layer; forming a slit penetrating the stack structure; forming spacer insulating layers on sidewalls of the slit; forming a first through part between the spacer insulating layers, wherein the first through part penetrates the multi-layered memory layer and exposes the channel layer; and forming first source contact patterns on the spacer insulating layers to be in contact with the channel layer exposed through the first through part.

BRIEF DESCRIPTION OF THE DRAWINGS

Example embodiments are described hereinafter with reference to the accompanying drawings. The drawings represent a limited number of possible embodiments. Therefore, provided drawings and descriptions should not be construed as precluding other possible embodiments consistent with the presented claims. Presented embodiments are described to convey the present teachings to those of skill in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout the drawings.

DETAILED DESCRIPTION

The technical spirit of the present disclosure may be changed in various manners and may be implemented by different embodiments having various aspects. Hereinafter, the present disclosure is described by way of a limited number of possible embodiments so that those of skill in the art can easily understand and practice the present teachings.

Although the terms "first" and/or "second" are used herein to describe various elements, these elements should not be limited by these terms. The terms are only used to distinguish one element from another element, the terms are not meant to imply a number or order of elements. For instance, a first element and a second element can be referred to as the second element and the first element without departing from the teachings of the present disclosure.

When one element is referred to as being "coupled" or "connected" to another element, the one element can be directly coupled or connected to the other element or intervening elements may be present between the "coupled" or "connected". In contrast, when an element is referred to as being "directly coupled" or "directly connected" to another element, there are no intervening elements present between the "directly coupled" or "directly connected" elements. Other expressions that explain a relationship between elements, such as "between," "directly between," "adjacent to," or "directly adjacent to," should be construed in the same way.

The terminology used herein is for the purpose of describing particular embodiments only and is not intended to be limiting. In the present disclosure, singular forms are intended to include the plural forms as well, unless the context clearly indicates otherwise. It will be further understood that the terms "comprise," "include," "have," etc., when used in this specification, specify the presence of stated features, numbers, steps, operations, elements, components, and/or combinations thereof but do not preclude the presence or addition of one or more other features, numbers, steps, operations, elements, components, and/or combinations.

Presented embodiments relate to three-dimensional semiconductor devices having improved operational reliability and the manufacturing of such semiconductor devices.

Figure 1A:
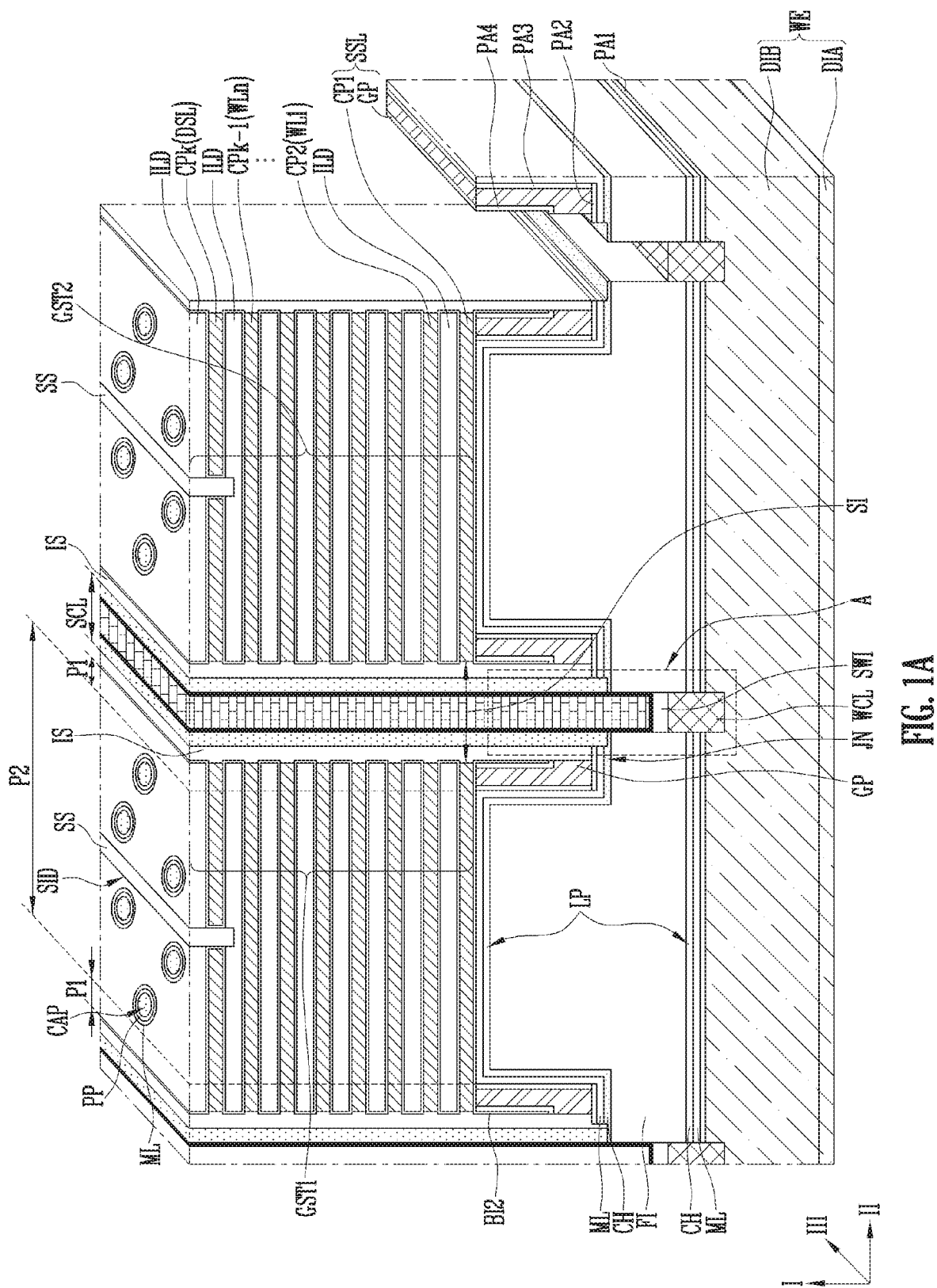
FIGS. 1A and 1B show perspective views illustrating semiconductor devices, according to embodiments of the present disclosure.
Figure 1B:
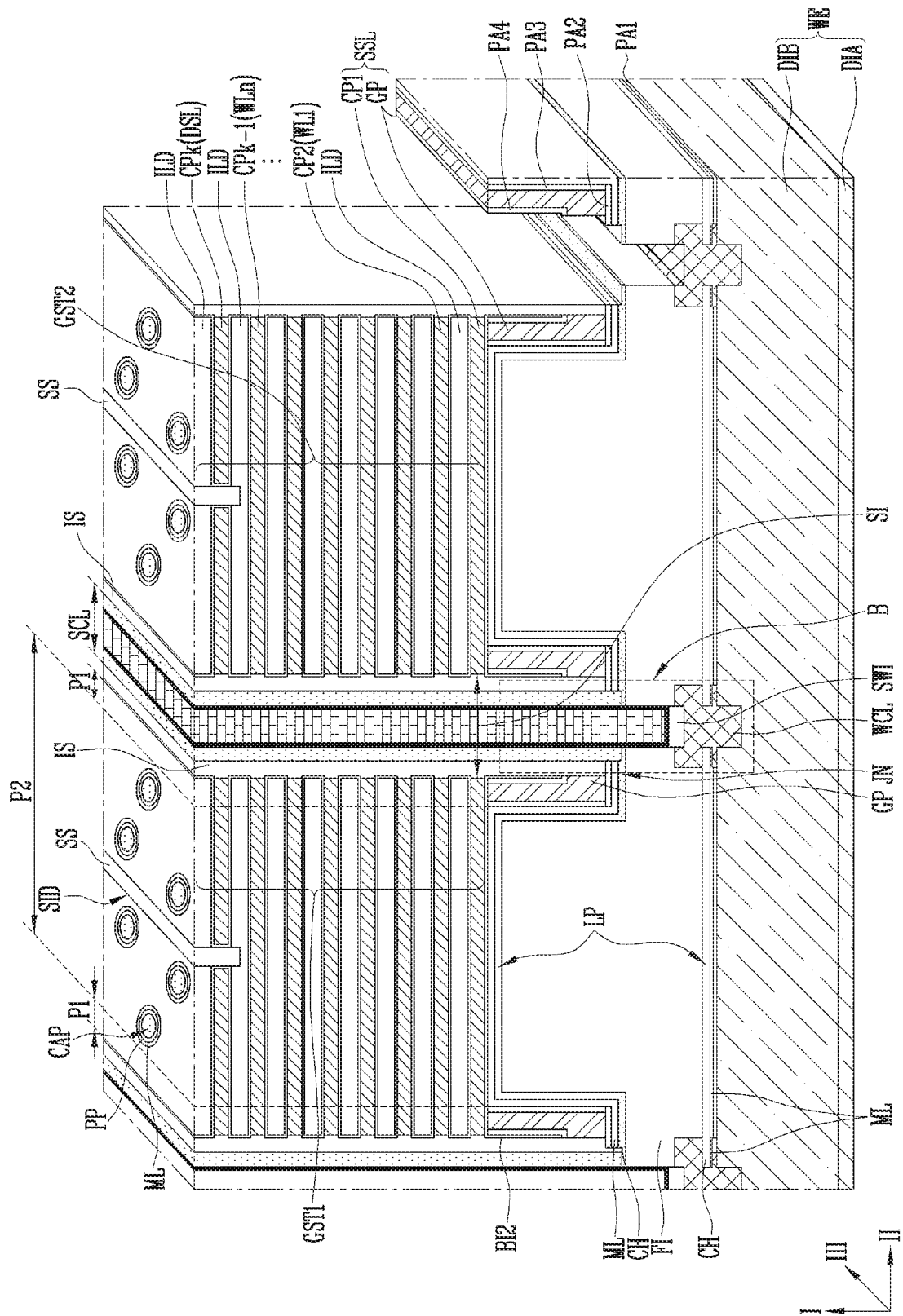

FIGS. 1A and 1B show perspective views illustrating semiconductor devices, according to embodiments of the present disclosure.

Referring to FIGS. 1A and 1B, each of the semiconductor devices may include a well structure WE including a dopant of a first conductivity type, gate stack structures GST1 and GST2 disposed above the well structure WE, channel patterns CH extending to a space between the well structure WE and the gate stack structures GST1 and GST2 from the inside of the gate stack structures GST1 and GST2, source gate patterns GP disposed under each of the gate stack structures GST1 and GST2 to be spaced apart from each other, well contact structures WCL connected to the well structure WE, slits SI separating the gate stack structures GST1 and GST2 from each other, and source contact structures SCL disposed in the slits SI to be connected to the channel patterns CH.

The slits SI may separate, into a plurality of gate stack structures, a stack structure including horizontal conductive patterns CP1 to CPk and interlayer insulating layers ILD, which are alternately stacked in a first direction I. Although FIGS. 1A and 1B illustrate a first gate stack structure GST1 and a second gate stack structure GST2, the number of gate stack structures separated by the slits SI may be two or more.

The gate stack structures GST1 and GST2 are spaced apart from the well structure WE in the first direction I. Each of the gate stack structures GST1 and GST2 may include horizontal conductive patterns CP1 to CPk and interlayer insulating layers ILD, which are alternately stacked in the first direction I. Each of the gate stack structures GST1 and GST2 may be divided into side regions P1 and a center region P2. The side regions P1 are regions adjacent to the slits SI and the source contact structures SCL. The center region P2 is a region that is disposed between the side regions P1 and extends from the side regions P1.

The interlayer insulating layers ILD may be formed of an insulating material such as oxide. The interlayer insulating layers ILD may be respectively disposed between the horizontal conductive patterns CP1 to CPk adjacent to each other in the first direction I.

The horizontal conductive patterns CP1 to CPk and the source gate patterns GP correspond to gate lines SSL, WL1 to WLn, and DSL used as gate electrodes of transistors. The horizontal conductive patterns CP1 to CPk may be formed of a conductive material different from that of the source gate patterns GP.

The source gate patterns GP may be formed of a material selected by considering an etch rate, to serve as etch stop layers while a manufacturing process of the semiconductor device is being performed. For example, the source gate patterns GP may be formed of doped silicon layers. The source gate patterns GP may include an n-type dopant. The source gate patterns GP may be formed thick enough in the manufacturing process to serve as etch stop layers. For example, each of the source gate patterns GP may be formed thicker in the first direction I than each of the horizontal conductive patterns CP1 to CPk.

The horizontal conductive patterns CP1 to CPk may be formed of a conductive material different from that of the source gate patterns GP. The horizontal conductive patterns CP1 to CPk may be formed of the same conductive material. The horizontal conductive patterns CP1 to CPk may be formed of a conductive material having a resistance lower than that of the source gate patterns GP. For example, each of the horizontal conductive patterns CP1 to CPk may include at least one of a metal layer and a metal silicide layer. The horizontal conductive patterns CP1 to CPk may include tungsten having a low resistance.

The source gate patterns GP are disposed between the gate stack structures GST1 and GST2 and the well structure WE to be spaced apart from the well structure WE. The source gate patterns GP are spaced apart from each other in a second direction II intersecting the first direction I. The source gate patterns GP are used as source select lines SSL. The source gate patterns GP, respectively, overlap with the side regions P1 of the gate stack structures GST1 and GST2, and do not overlap with the center regions P2 of the gate stack structures GST1 and GST2. When each of the source gate patterns GP is formed of doped silicon layers, the doped silicon layer may serve as an etch stop layer but increase the resistance of the source select line SSL. According to embodiments of the present disclosure, each of the source gate patterns GP does not overlap with the center region P2 of the gate stack structure GST1 or GST2 and only overlaps with each of the side regions P1 of the gate stack structure GST1 or GST2. Accordingly, in the embodiments of the present disclosure, an increase in the resistance of the source select line SSL due to the source gate pattern GP can be reduced.

A first horizontal conductive pattern CP1 disposed closest to the source gate patterns GP among the horizontal conductive patterns CP1 to CPk is used as a source select line SSL connected to a gate electrode of a source select transistor. The first horizontal conductive pattern CP1 and a pair of source gate patterns GP overlapping with the bottom thereof may be electrically connected to each other to constitute one source select line SSL.

In order to electrically connect the first horizontal conductive pattern CP1 and the source gate patterns GP to each other, contact plugs (not shown) may be respectively connected to the first horizontal conductive pattern CP1 and the source gate patterns GP, and may be commonly connected using a metal line. Alternatively, the first horizontal conductive pattern CP1 and the source gate patterns GP may operate by a capacitive coupling between the first horizontal conductive pattern CP1 and the source gate patterns GP. That is, although a voltage is applied to any one of the first horizontal conductive pattern CP1 and the source gate patterns GP, the voltage may be applied to the other, using a coupling phenomenon.

An uppermost horizontal conductive pattern CPk disposed most distant from the source gate patterns GP among the horizontal conductive patterns CP1 to CPk may be used as a drain select line DSL connected to a gate electrode of a drain select transistor. Horizontal conductive patterns CP2 to CPk−1 between the drain select line DSL and the source select line SSL may be used as word lines WL1 to WLn connected to gate electrodes of memory cell transistors.

Although FIGS. 1A and 1B illustrate a case where the first horizontal conductive pattern CP1 is used as the source select line SSL and the uppermost horizontal conductive pattern CPk is used as the drain select line DSL, the present disclosure is not limited to such embodiments. For example, one or more horizontal conductive patterns consecutively disposed in the upper direction from the first horizontal conductive pattern CP1 among the horizontal conductive patterns CP1 to CPk may be used as source select lines SSL, and one or more horizontal conductive patterns consecutively disposed in the lower direction from the uppermost horizontal conductive pattern CPk among the horizontal conductive patterns CP1 to CPk may be used as drain select lines DSL. The word lines WL1 to WLn are stacked between the source select line SSL and the drain select line DSL and spaced apart from each other.

The source select line SSL and the word lines WL1 to WLn may be disposed between the slits SI adjacent to each other. A select separation slit SID may be further disposed between the slits SI adjacent to each other. The select separation slit SID extends to penetrate the horizontal conductive pattern (e.g., CPk) used as the drain select line DSL. The select separation slit SID is filled with a select separation insulating layer SS. The drain select lines DSL disposed in the same layer between the slits SI adjacent to each other are separated from each other by the select separation insulating layer SS. The depth of the select separation slit SID and the select separation insulating layer SS may be controlled so as not to penetrate the source select line SSL and the word lines WL1 to WLn.

Each of the channel patterns CH may include pillar parts PP and a connecting part LP. The pillar parts PP penetrate the center region P2 of the gate stack structure GST1 or GST2, and the connecting part LP is disposed under the gate stack structure GST1 or GST2 to connect the pillar parts PP. The pillar parts PP are surrounded by the horizontal conductive patterns CP1 to CPk and the interlayer insulating layers ILD. The connecting part LP extends to a space between the well structure WE and the gate stack structure GST1 or GST2. The connecting part LP extends along a bottom surface of the gate stack structure GST1 or GST2, extends along surfaces of the source gate patterns GP, and extends along an upper surface of the well structure WE. The pillar parts PP and the connecting part LP may be integrally formed. The integrated channel pattern CH including the pillar parts PP and the connecting part LP is described in more detail with reference to FIG. 4.

Each of the channel patterns CH may be surrounded by a multi-layered memory pattern ML. The multi-layered memory pattern ML extends along an outer surface of each of the channel patterns CH. The pillar parts PP of each of the channel patterns CH may include an upper end surrounding a capping pattern CAP. A portion of the multi-layered memory pattern ML, which is disposed between the channel pattern CH and the drain select line DSL, and a portion of the multi-layered memory pattern ML, which is disposed between the channel pattern CH and the source select line SSL, may be used as gate insulating layers. The structure of the multi-layered memory pattern ML is described in more detail later with reference to FIGS. 2A, 2B, 3A, and 3B. The channel patterns CH may be formed to respectively surround insulating patterns FI. The structure of the insulating pattern FI and the channel pattern CH are described in more detail later with reference to FIG. 4.

Each of the channel patterns CH may include a source contact surface. The source contact surface is a surface in contact with the source contact structure SCL. In order to increase the area of the source contact surface, the source contact surfaces according to the embodiments of the present disclosure extends along a partial bottom surface of each of the source contact structures SCL. Contact surfaces between the source contact structures SCL and the channel patterns CH are described in more detail later with reference to FIGS. 2A, 2B, 3A, and 3B.

Each of the channel patterns CH may include a well contact surface in contact with the well contact structure WCL. The source contact surface and the well contact surface may be spaced apart from each other with the insulating pattern FI interposed therebetween.

The slits SI, the source contact structures SCL, and the well contact structures WCL extend along a third direction III intersecting the first and second directions I and II.

Each of the source contact structures SCL extends in the first direction I between the gate stack structures GST1 and GST2 adjacent to each other to face sidewalls of the gate stack structures GST1 and GST2. Each of the source contact structures SCL is disposed in the slit SI between the gate stack structures GST1 and GST2 adjacent to each other.

Spacer insulating layers IS are disposed on sidewalls of the slits SI. The spacer insulating layers IS are respectively disposed between the source contact structures SCL and the gate stack structures GST1 and GST2, and may be disposed on the sidewalls of the slits SI. The spacer insulating layers IS may cover the sidewalls of the source gate patterns GP. The source contact structures SCL may be insulated from the gate stack structures GST1 and GST2 and the source gate patterns GP by the spacer insulating layers IS. The connecting part LP of each of the channel patterns CH may extend under the spacer insulating layer IS to overlap with the spacer insulating layer IS.

The source contact structures SCL are formed on the spacer insulating layers IS, and may protrude farther toward the well structure WE than the spacer insulating layers IS and the source gate patterns GP. The source contact structures SCL may be configured with a plurality of material layers, and the configuration of the source contact structures SCL are described in more detail later with reference to FIGS. 2A, 2B, 3A, and 3B.

The connecting part LP of each of the channel patterns CH may include a source junction JN. The source junction JN is a dopant distribution region as a region in the channel patterns CH adjacent to the source contact structure SCL. A dopant distributed in the source junction JN is a dopant diffused from the source contact structure SCL, and may include an n-type dopant. The distance between the source junction JN and the source select line SSL may be shortened by the source gate patterns GP, and therefore, the turn-on current of the source select transistor connected to the source select line SSL may be increased.

The well structure WE is disposed under the source gate patterns GP, and may extend to overlap with the gate stack structures GST1 and GST2. The well structure WE may include at least one doped semiconductor layer including a dopant of the first conductivity type. For example, the well structure WE may be formed by a structure in which a first doped silicon layer DIA including the dopant of the first conductivity type with a first concentration and a second doped silicon layer DIB including the dopant of the first conductivity type with a second concentration are stacked. The first doped silicon layer DIA may include the dopant of the first conductivity type with the first concentration higher than the second concentration. The dopant of the first conductivity type may be a p-type dopant. Although not shown in the drawings, a driving circuit may be formed on a substrate under the well structure WE to overlap with the well structure WE.

The well stack structures WCL are disposed between the source contact structures SCL and the well structure WE. The well stack structures WCL are in contact with the channel patterns CH and the well structure WE. The channel patterns CH may be electrically connected to the well structure WE via the well contact structures WCL. The well contact structures WCL may be formed of a conductive material. For example, the well contact structures WCL may be formed of a silicon layer. Each of the well contact structures WCL may be in direct contact with the well structure WE and the connecting part LP by penetrating a portion of the connecting part LP extending along the upper surface of the well structure WE.

Inter-well-source insulating layers SWI may be further disposed between the well contact structures WCL and the source contact structures SCL. Each of the inter-well-source insulating layers SWI extends in the third direction III.

A second blocking insulating layer BI2 may be further formed at each of interfaces between the interlayer insulating layers ILD and the horizontal conductive patterns CP1 to CPk and interfaces between the multi-layered memory pattern ML and the horizontal conductive patterns CP1 to CPk. The second blocking insulating layer BI2 may extend between the spacer insulating layers IS and the source gate patterns GP and between the spacer insulating layers IS and the interlayer insulating layers ILD. The second blocking insulating layer BI2 may be formed of an insulating layer having a dielectric constant higher than that of a first blocking insulating layer constituting the multi-layered memory pattern ML. The first blocking insulating layer is described in more detail later with reference to FIGS. 2A, 2B, 3A, and 3B. The second blocking insulating layer BI2 may be formed of aluminum oxide. Although not shown in the drawings, a barrier layer for preventing direct contact between each of the horizontal conductive patterns CP1 to CPk and the second blocking insulating layer BI2 may be further formed at an interface between the horizontal conductive patterns CP1 to CPk and the second blocking insulating layer BI2. The barrier layer may include titanium nitride, tungsten nitride, tantalum nitride, etc.

In a process of manufacturing the semiconductor device, protective layers PA1 to PA4 for protecting the well structure WE and the source gate patterns GP may be formed, and at least one of the protective layers PA1 to PA4 may remain. A first protective layer PA1 may remain between the well structure WE and the multi-layered memory pattern ML. A second protective layer PA2 may remain between a bottom surface of each of the source gate patterns GP and the multi-layered memory pattern ML. A third protective layer PA3 may remain between a sidewall of each of the source gate patterns GP and the multi-layered memory pattern ML. A fourth protective layer PA4 may remain between the sidewall of the source gate patterns GP and the second blocking insulating layer BI2.

As shown in FIG. 1A, the well contact structure WCL may be formed as a vertical part extending in the first direction I to be in contact with a sidewall of the channel pattern CH and a sidewall of the well structure WE. Alternatively, as shown in FIG. 1B, the well contact structure WCL may include a vertical part extending in the first direction I and horizontal parts extending parallel to the upper surface of the well structure WE. The contact surface between the well contact structure WCL and the well structure WE or the contact surface between the well contact structure WCL and the channel pattern CH may be widened through the horizontal parts of the well contact structure WCL, which are shown in FIG. 1B. The vertical part and the horizontal parts of the well contact structure WCL are described in more detail with reference to FIGS. 2A, 2B, 3A, and 3B.

According to the embodiments shown in FIGS. 1A and 1B, a source gate pattern GP disposed closer to the source junction JN than the first horizontal conductive pattern CP1 of the source select line SSL remains. The source gate pattern GP may be used as the gate electrode of the source select transistor. Since the source gate pattern GP is disposed close to the source junction JN, the turn-on current of the source select transistor may be increased.

According to the embodiments shown in FIGS. 1A and 1B, source select transistors may be defined at intersections of the pillar parts PP and the source select line SSL, memory cell transistors may be defined at intersections of the pillar parts PP and the word lines WL1 to WLn, and drain select transistors may be defined at intersections of the pillar parts PP and the drain select line DSL. The memory cell transistors may be three-dimensionally arranged along the first to third directions I to III to constitute a three-dimensional semiconductor device. The source select transistor may include a gate all around (GAA) structure and a planar structure. The GAA structure of the source select transistor is defined by each of the pillar parts PP and a horizontal conductive pattern (e.g., CP1) used as the source select line SSL. The planar structure of the source select transistor is defined by the source gate pattern GP and the connecting part LP. The drain select transistor and the memory cell transistors may be formed in the GAA structure by the horizontal conductive patterns CP2 to CPk surrounding the pillar parts PP.

The connecting part LP of each of the channel patterns CH includes a part electrically connected to the well structure WE including the dopant of the first conductivity type. The well structure WE is electrically connected to the connecting part LP through the well contact structure WCL. The connecting part LP of each of the channel patterns CH includes a part electrically connected to the source contact structure SCL including the dopant of the second conductivity type. The source contact structure SCL and the well contact structure WCL are structurally distinguished from each other by the inter-well-source insulating layer SWI. Thus, the flow of current can be controlled to face the source contact structures SCL in a program operation and a read operation, and holes can be supplied through the well structure WE in an erase operation. Accordingly, for embodiments of the present disclosure, the operation characteristics of a semiconductor device can be improved.

Figure 2A:
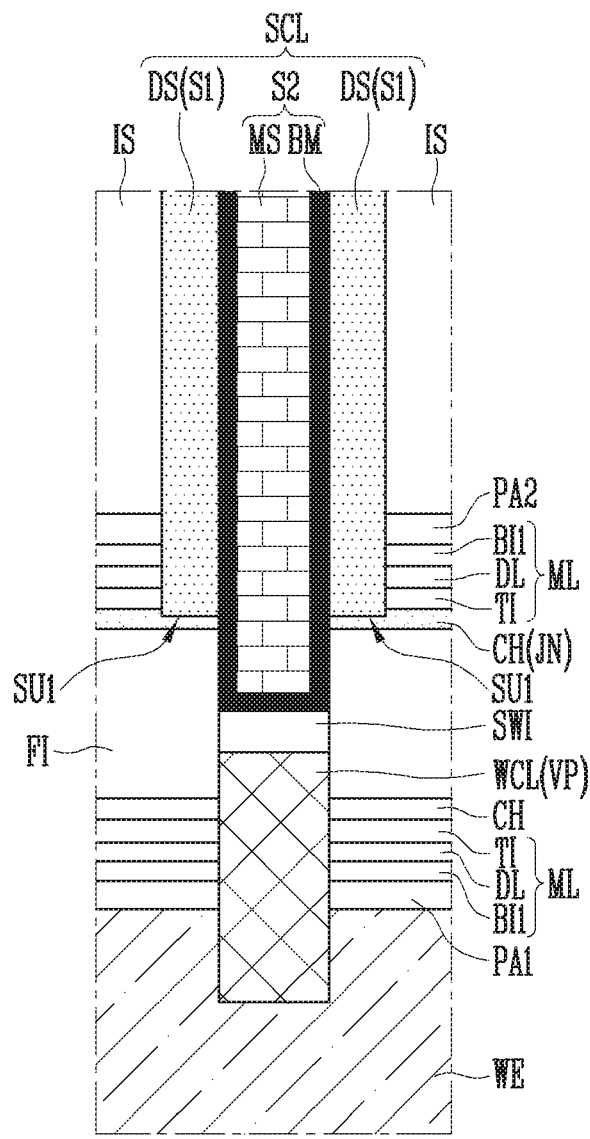
FIGS. 2A and 2B show enlarged sectional views illustrating region A shown in FIG. 1A and region B shown in FIG. 1B, respectively.
Figure 2B:
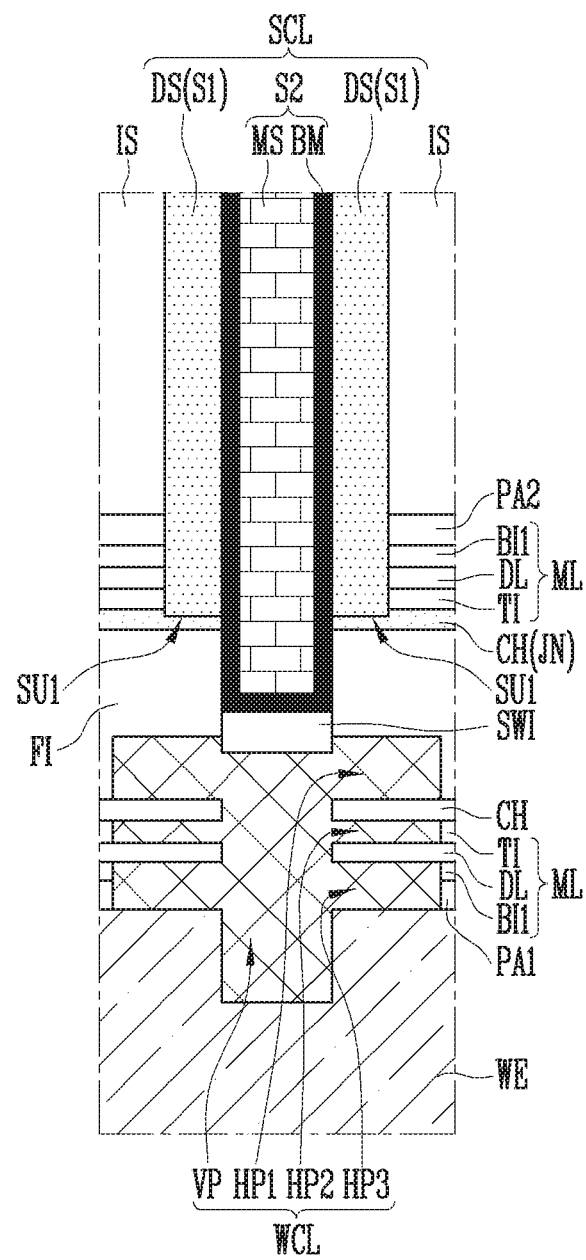
Figure 3A:
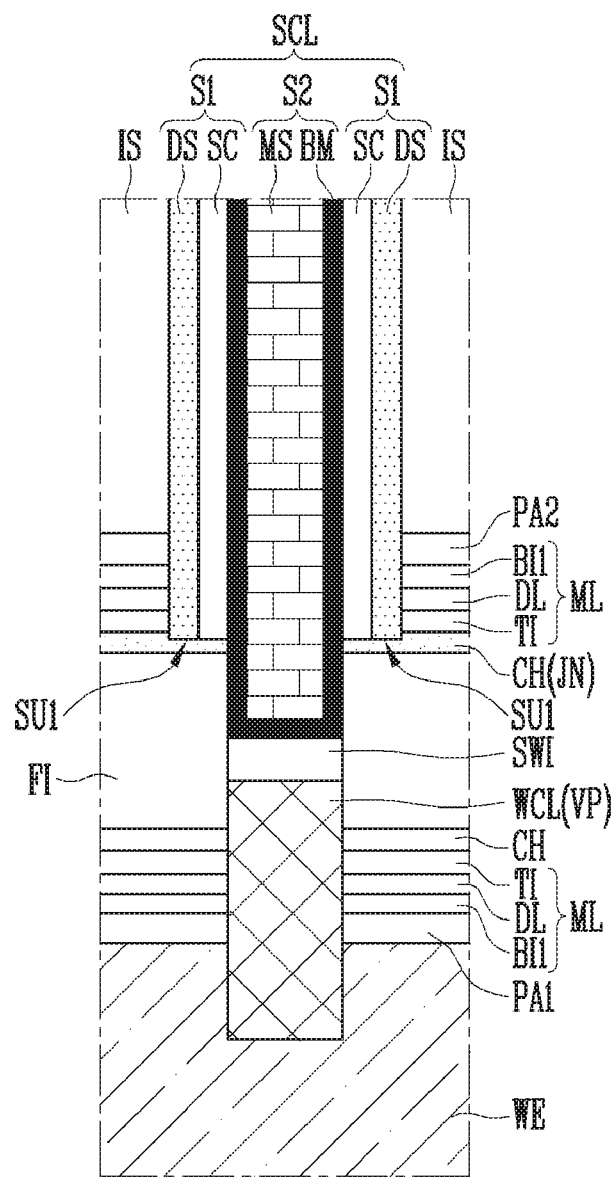
FIGS. 3A and 3B show sectional views illustrating modifications of a source contact structure.
Figure 3B:
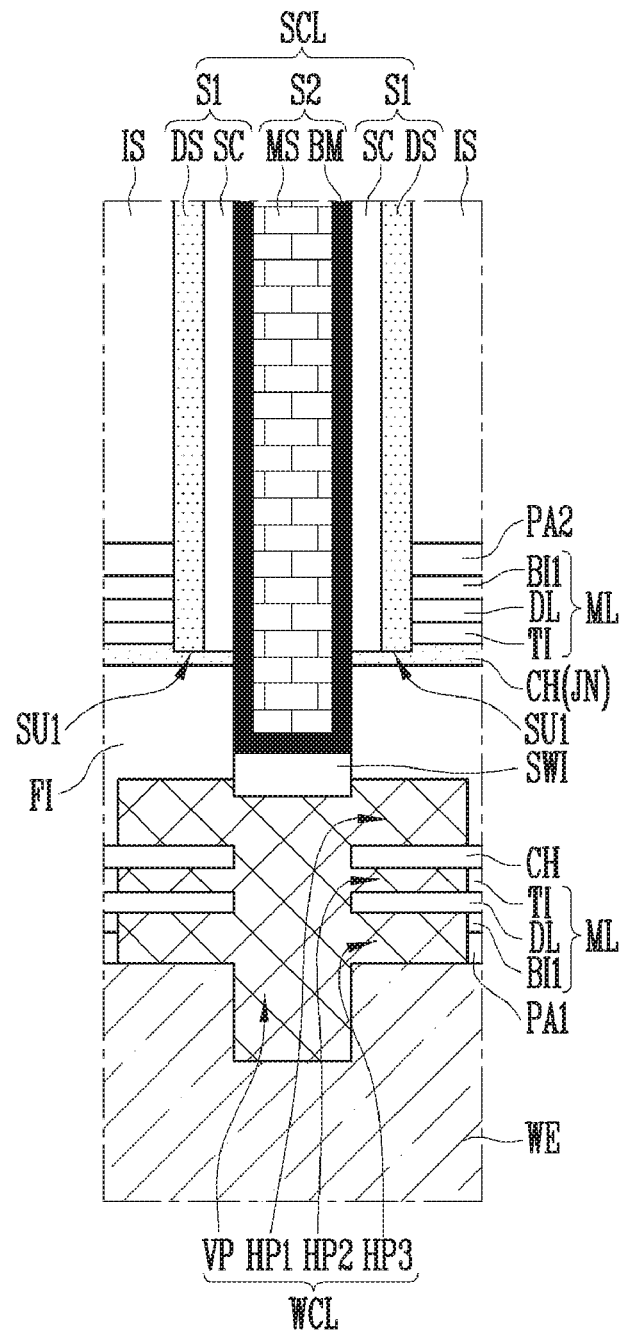

FIGS. 2A and 2B show enlarged sectional views illustrating region A shown in FIG. 1A and region B shown in FIG. 1B, respectively. FIGS. 3A and 3B show sectional views illustrating modifications of the source contact structure. The source contact structure shown in FIG. 3A may be applied to the semiconductor memory device shown in FIG. 1A, and the source contact structure shown in FIG. 3B may be applied to the semiconductor memory device shown in FIG. 1B.

Referring to FIGS. 2A, 2B, 3A, and 3B, the channel pattern CH may include an inner wall and an outer wall, which face directions opposite to each other. The inner wall of the channel pattern CH is defined as a surface facing the insulating pattern FI. The multi-layered memory pattern ML may surround the outer wall of the channel pattern CH.

The multi-layered memory pattern ML may include a tunnel insulating layer TI, a data storage layer DL, and a first blocking insulating layer BI1, which surround the channel pattern CH. The tunnel insulating layer TI is disposed between the data storage layer DL and the channel pattern CH. The data storage layer DL and the tunnel insulating layer TI are disposed between the first blocking insulating layer BI1 and the channel pattern CH. The data storage layer DL may store data changed using Fowler-Nordheim tunneling caused by a difference in voltage between the channel pattern CH and the word lines WL1 to WLn shown in FIGS. 1A and 1B. To this end, the data storage layer DL may be formed of various materials. For example, the data storage layer DL may be formed of a nitride layer in which charges can be trapped. In addition, the data storage layer DL may include silicon, a phase change material, nanodots, and the like. The first blocking insulating layer BI1 may include an oxide layer capable of blocking charges. The tunnel insulating layer TI may include a silicon oxide layer.

The source contact structure SCL may include first source contact patterns S1 and a second source contact pattern S2. The first source contact patterns S1 are respectively formed on the spacer insulating layers IS, and protrude farther toward the well structure WE than the spacer insulating layers IS. The second source contact pattern S2 fills in a space between the first source contact patterns S1, and protrudes farther toward the well structure WE than the first source contact patterns S1.

Each of the first source contact patterns S1 includes a first surface SU1 facing the well structure WE. The first surface SU1 is used as a source contact surface of a channel pattern CH corresponding thereto. A portion of each of the channel patterns CH extends along a first surface SU1 corresponding thereto, to widen the source contact surface. The first source contact patterns S1 include a dopant of the second conductivity type different from the first conductivity type.

In an example, as shown in FIGS. 2A and 2B, each of the first source contact patterns S1 may be formed of a doped semiconductor layer DS. The doped semiconductor layer DS extends along the spacer insulating layer IS from the first surface SU1, and has a sidewall forming a common surface with that of the second source contact pattern S2.

In another example, as shown in FIGS. 3A and 3B, each of the first source contact patterns S1 may include a doped semiconductor layer DS and a metal silicide layer SC, which extend parallel to each other. The doped semiconductor layer DS extends along the spacer insulating layer IS from the first surface SU1, and faces the sidewall of the gate stack structure GST1 or GST2 described in FIGS. 1A and 1B. The metal silicide layer SC is disposed between the doped semiconductor layer DS and the second source contact pattern S2.

The doped semiconductor layer DS shown in FIGS. 2A, 2B, 3A, and 3B may include a dopant of the second conductivity type to be supplied to the inside of the channel patterns CH. The dopant of the second conductivity type may be an n-type dopant. The doped semiconductor layer DS shown in FIGS. 3A and 3B may be formed of a silicon layer for the purpose of a silicide process.

Referring to FIGS. 2A, 2B, 3A, and 3B, the second source contact pattern S2 extends along sidewall of the first source contact patterns S1, and extends beyond the first surface SU1 toward the well structure WE. The second source contact pattern S2 may separate the channel patterns CH from each other on the top of the insulating pattern FI, and extend to the inside of the insulating pattern FI. The second source contact pattern S2 may include a metal layer MS protruding farther toward the well structure WE than the first source contact patterns S1 and a barrier metal layer BM extending along a surface of the metal layer MS.

The metal silicide layer SC and the metal layer MS may have a resistance lower than that of the doped semiconductor layer DS, and decrease the resistance of the source contact structure SCL. The metal silicide layer SC may include tungsten silicide, nickel silicide, etc. The metal layer MS may include tungsten, etc. The barrier metal layer BM prevents diffusion of metal, and may include a titanium nitride layer, a tungsten nitride layer, a tantalum nitride layer, etc.

The source junction JN is defined in the channel pattern CH adjacent to the source contact structure SCL, and includes the same dopant of the second conductivity type as the doped semiconductor layer DS.

The second protective layer PA2 may remain between the spacer insulating layer IS and the multi-layered memory pattern ML. The second protective layer PA2 may be an oxide layer.

The well contact structure WCL disposed between the second source contact pattern S2 and the well structure WE may be formed in various forms.

FIG. 2A shows an enlarged view illustrating the well contact structure WCL shown in FIG. 1A, and FIG. 3A is a modification of the region shown in FIG. 2A. Referring to FIGS. 2A and 3A, the well contact structure WCL may include a vertical part VP extending toward the inter-well-source insulating layer SWI disposed under the second source contact pattern S2 from the inside of the well structure WE. The vertical part VP may be in contact with sidewalls of the channel patterns CH disposed on the bottom of the insulating pattern FI, and be in contact with a sidewall of each of the tunnel insulating layer TI, a data storage layer DL, and the first blocking insulating layer BI1, which are disposed between each of the channel patterns CH and the well structure WE. In addition, a sidewall of the first protective layer PA1 remaining between the well structure WE and the multi-layered memory pattern ML may also be in contact with the vertical part VP.

FIG. 2B shows an enlarged view illustrating the well contact structure WCL shown in FIG. 1B, and FIG. 3B shows a modification of the region shown in FIG. 2B. Referring to FIGS. 2B and 3B, the well contact structure WCL may include a vertical part VP and at least one of first to third horizontal parts HP1 to HP3 protruding from the vertical part VP. The vertical part VP is formed in the same structure as the vertical part VP described in FIGS. 2A and 3A.

The first horizontal part HP1 is a part extending toward the inside of the insulating pattern FI from the vertical part VP, and may extend between the insulating pattern FI and the channel pattern CH to increase the contact area between the channel pattern CH and the well contact structure WCL. The first horizontal part HP1 may be in contact with a partial upper surface of the channel pattern CH.

The second horizontal part HP2 is a part extending between the channel pattern CH and the data storage layer DL, and may increase the contact area between the channel pattern CH and the well contact structure WCL. The second horizontal part HP2 may be in contact with a partial lower surface of the channel pattern CH.

According to the above-described structure, the channel pattern CH extends between the first horizontal part HP1 and the second horizontal part HP2, to be in contact with the first horizontal part HP1 and the second horizontal part HP2. The tunnel insulating layer TI remains in a state in which it is in contact with a sidewall of the second horizontal part HP2, and the data storage layer DL remains in a state in which it protrudes farther toward the vertical part VP than the tunnel insulating layer TI and is in contact with a sidewall of the vertical part VP.

The third horizontal part HP3 may extend in parallel to the first horizontal part HP1 or the second horizontal part HP2 to be in contact with the upper surface of the well structure WE. The contact area between the well structure WE and the well contact structure WCL may be increased by the third horizontal part HP3. The first blocking insulating layer BI1 and the first protective layer PA1 remain in a state in which they are in contact with a sidewall of the third horizontal part HP3. The data storage layer DL remains in a state in which it protrudes farther toward the vertical part VP than the first blocking insulating layer BI1 and the first protective layer PA1. The data storage layer DL may fill in a space between the second horizontal part HP2 and the third horizontal part HP3. The data storage layer DL may remain in a state in which it is in contact with the sidewall of the vertical part VP.

Figure 4:
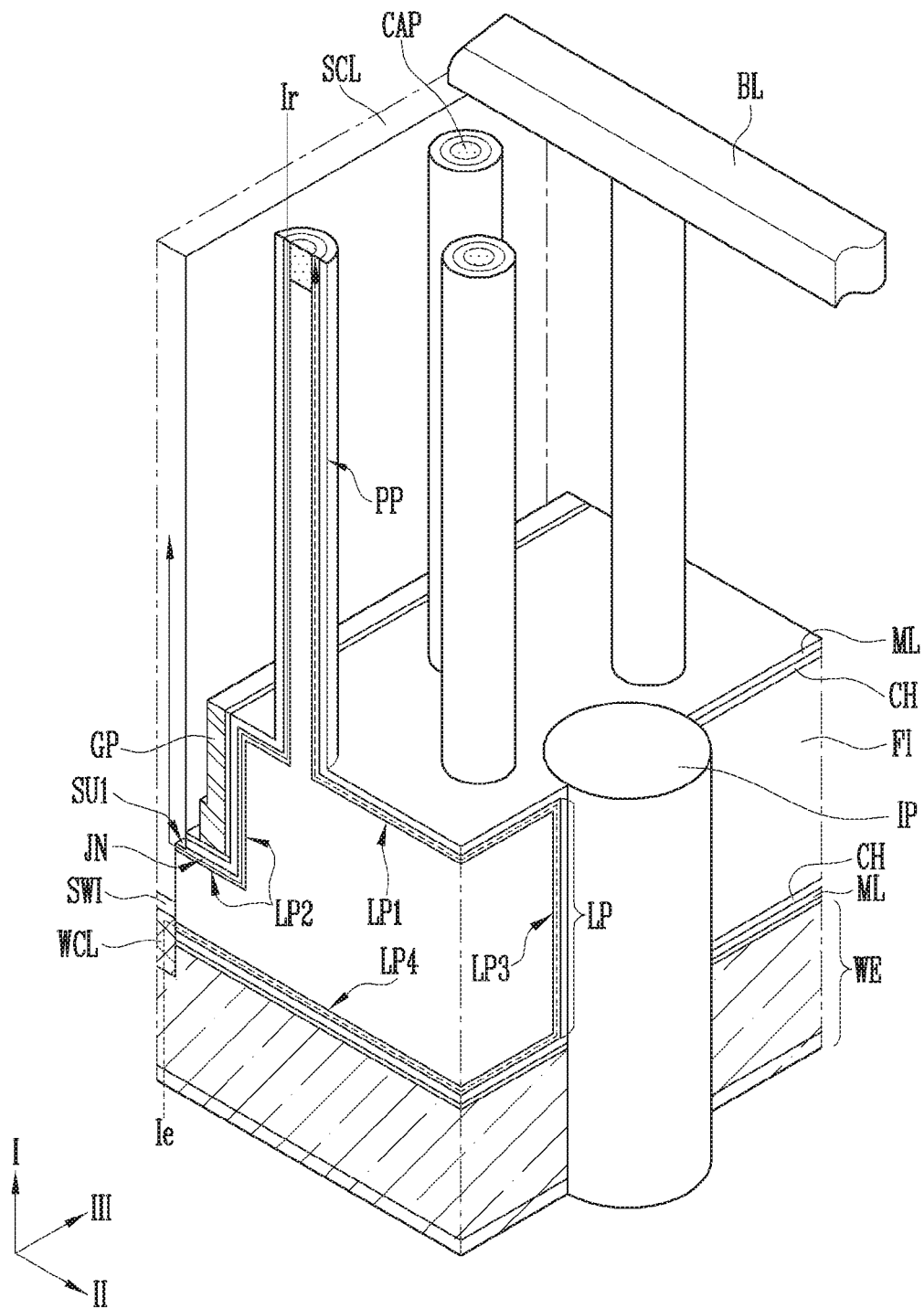
FIG. 4 shows a perspective view illustrating a structure of a channel pattern and a flow of current in the channel pattern, according to an embodiment of the present disclosure.

FIG. 4 shows a perspective view illustrating in more detail a structure of the channel pattern, according to an embodiment of the present disclosure, and illustrating a flow of current in the channel pattern. In FIG. 4, some components are omitted for convenience of description, and some components are schematically illustrated.

Referring to FIG. 4, the semiconductor device may further include a support IP disposed under the gate stack structure GST1 or GST2 shown in FIG. 1A or 1B. Although FIG. 4 illustrates one support IP, a plurality of supports may support a space between the gate stack structure and the well structure WE. The arrangement of supports is described in more detail later with reference to FIGS. 5A and 5B. The support IP may extend to the inside of the well structure WE. For example, the support IP may be formed to a depth where it penetrates the well structure WE.

The channel pattern CH includes pillar parts PP and a connecting part LP as described in FIGS. 1A and 1B. The pillar parts PP are parts that extend along the first direction I and penetrate the gate stack structure GST1 or GST2 shown in FIGS. 1A and 1B. The connecting part LP is a part connecting the pillar parts PP. A central region of each of the pillar parts PP of the channel pattern CH is filled with the insulating pattern FI, and the insulating pattern FI extends to a space between the gate stack structure GST1 or GST2 shown in FIGS. 1A and 1B and the well structure WE. The support IP penetrates the insulating pattern FI.

The connecting part LP of the channel pattern CH may include first to fourth connecting parts LP1 to LP4. The first connecting part LP1 is a part extending along the bottom surface of the gate stack structure GST1 or GST2 of FIG. 1A or 1B from the pillar parts PP. The second connecting part LP2 is a part extending from the first connecting part LP1 to contact the first surface SU1 of the source contact structure SCL, which faces the well structure WE. The second connecting part LP2 extends along a surface of the source gate pattern GP toward the first surface SU1 from the first connecting part LP1. The third connecting part LP3 is a part extending along a sidewall of the support IP from the first connecting part LP1. The fourth connecting part LP4 is a part extending along the upper surface of the well structure WE from the third connecting part LP3.

The multi-layered memory pattern ML surrounds outer walls of the pillar parts PP, and extends to an upper surface of the first connecting part LP1. In addition, the multi-layered memory pattern ML extends between the second connecting part LP2 and the source gate pattern GP, between the third connecting part LP3 and the support IP, and between the fourth connecting part LP4 and the well structure WE. The well structure WE is in contact with the fourth connecting part LP4, and the source junction JN is formed in the second connecting part LP2.

The channel pattern CH is formed to surround the insulating pattern FI. The insulating pattern FI extends to fill in a space between the first connecting part LP1 and the fourth connecting part LP4 while surrounding the pillar parts PP. The insulating pattern FI may be formed with a height lower than that of the pillar parts PP. Capping patterns CAP surrounded by the pillar parts PP may be disposed on the insulating pattern FI. Each of the capping patterns CAP may be formed of a semiconductor layer including a dopant of the second conductivity type. For example, each of the capping patterns CAP may be formed of a doped silicon layer doped with an n-type dopant. Each of the capping patterns CAP may be used as a drain junction.

Each of the pillar parts PP of the channel pattern CH may be connected to a bit line BL corresponding thereto. Although FIG. 4 illustrates one bit line BL for convenience of description, the semiconductor device includes a plurality of bit lines, and the layout of the bit lines may be variously designed.

According to the above-described structure, a first current flow path Ir may be formed during a read operation of the semiconductor device. The first current flow path Ir is formed in the channel pattern CH connected between the bit line BL and the source contact structure SCL. In the read operation, the bit line BL is precharged at a predetermined level. Also, in the read operation, a turn-on voltage may be applied to the drain select line DSL and the source select line SSL, which are shown in FIG. 1A or 1B. When a voltage level applied to the word lines WL shown in FIG. 1A or 1B is higher than threshold voltages of the memory cell transistors connected to the word lines WL, a channel may be formed in the channel pattern CH between the bit line BL and the source contact structure SCL, and a precharge level of the bit line BL may be discharged through a ground (not shown) electrically connected to the source contact structure SCL.

A second current flow path Ie may be formed during an erase operation of the semiconductor device. The second current flow path Ie is formed in the channel pattern CH connected between the bit line BL and the well structure WE. In the erase operation, an erase voltage may be applied to the well structure WE. Holes may be injected into the channel pattern CH by the erase voltage applied to the well structure WE.

The inter-well-source insulating layer SWI disposed between the source contact structure SCL and the well contact structure WCL can reduce a leakage current between the source junction JN and the well structure WE.

Although FIG. 4 illustrates the well contact structure shown in FIGS. 1A, 2B, and 3B, an embodiment including the well contact structure WCL shown in FIGS. 1A, 2B, and 3B may also control the flow of current as described for FIG. 4. A portion of the channel pattern CH extending between the first horizontal part HP1 and the second horizontal part HP2 to be in contact with the first horizontal part HP1 and the second horizontal part HP2 of the well contact structure WCL described in FIGS. 2B and 3B corresponds to the fourth connecting part LP4 of the channel pattern CH described in FIG. 4.

Figure 5A:
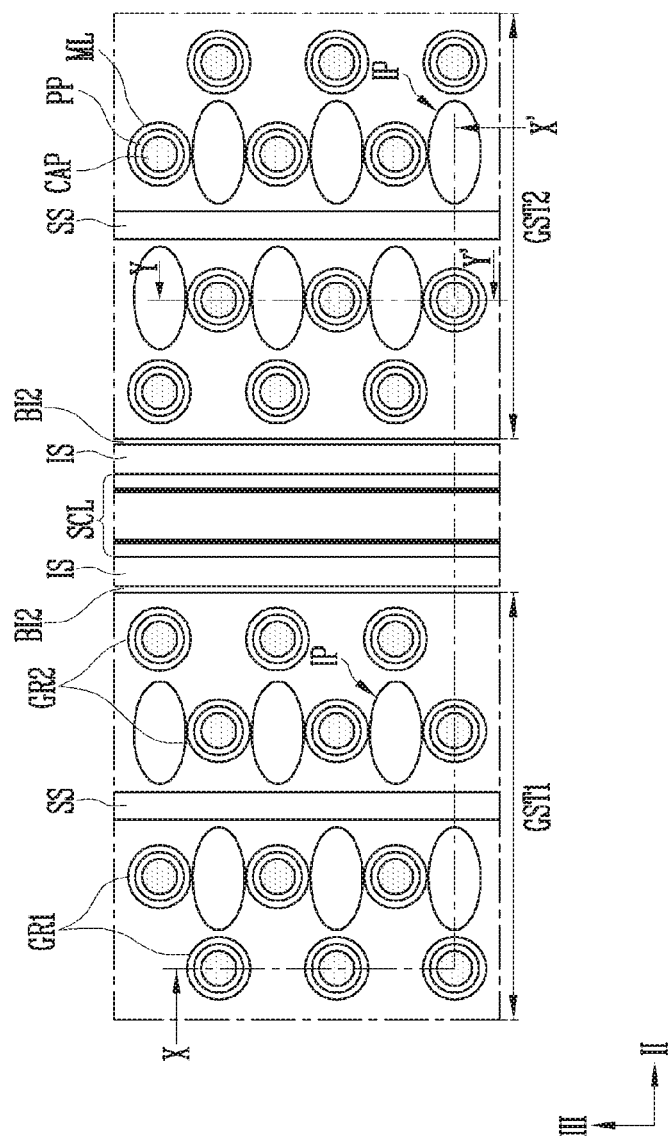
FIGS. 5A and 5B show plan views illustrating a layout of supports, pillar parts of channel patterns, and a source contact structure.
Figure 5B:
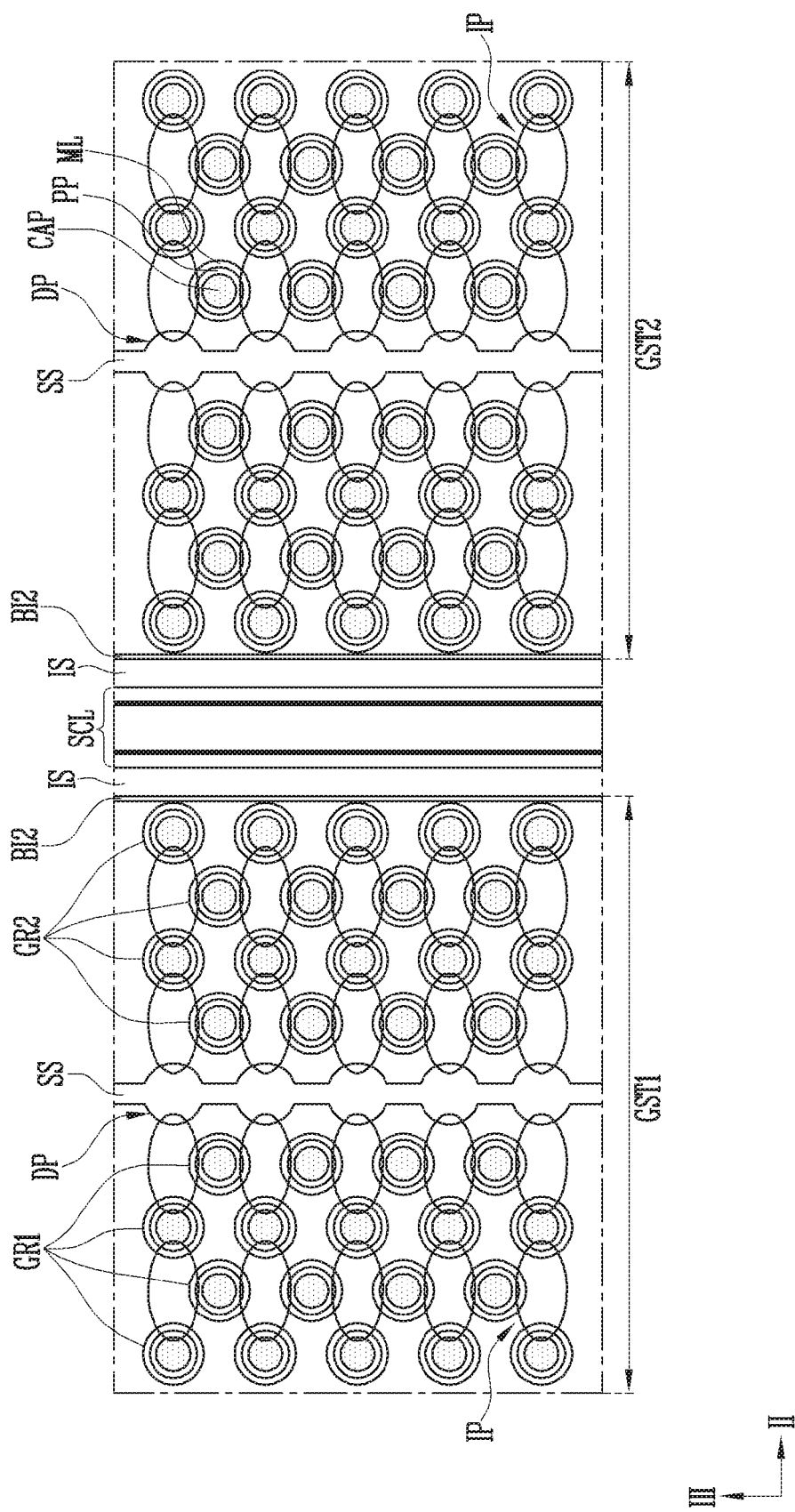

FIGS. 5A and 5B show plan views illustrating a layout of the supports, the pillar parts of the channel patterns, and the source contact structure. The plan view of FIG. 5A shows a plan view of the semiconductor device shown in FIG. 1A or 1B. FIG. 5B shows a modification of the layout of the supports and the pillar parts.

Referring to FIGS. 5A and 5B, as described above, each of the pillar parts PP may be surrounded by the multi-layered memory pattern ML, and may surround the capping pattern CAP.

The pillar parts PP penetrating each of the gate stack structures GST1 and GST2 may be divided into a first group GR1 and a second group GR2, which are disposed with the select separation insulating layer SS interposed therebetween. In order to improve the arrangement density of memory strings, the pillar parts PP of the first group GR1 and the pillar parts PP of the second group GR2 may be arranged in zigzag, as shown.

The gate stack structures GST1 and GST2 are arranged adjacent to each other in the second direction II with the source contact structure SCL interposed therebetween, and may be insulated from the source contact structure SCL by the spacer insulating layer IS. The second blocking insulating layer BI2 may remain between each of the gate stack structures GST1 and GST2 and the spacer insulating layer IS.

The supports IP are disposed under the gate stack structures GST1 and GST2 as described in FIG. 4. The supports IP may be disposed between the pillar parts PP so as not to overlap with the pillar parts PP as shown in FIG. 5A. Alternatively, the supports IP may overlap with portions of the pillar parts PP as shown in FIG. 5B.

Referring to FIGS. 5A and 5B, the supports IP may be disposed between the pillar parts PP adjacent to each other. The support parts IP may be arranged in zigzag, as shown. The layout of the supports IP is not limited to the examples shown in FIGS. 5A and 5B, but may be variously modified.

The number of first channel columns defined by the pillar parts PP of the first group GR1 penetrating each of the gate stack structures GST1 and GST2 and the number of second channel columns defined by the pillar parts PP of the second group GR2 penetrating each of the gate stack structures GST1 and GST2 may be variously designed.

For example, as shown in FIG. 5A, the first channel columns may be configured with first and second columns, and the second channel column may be configured with first and second columns.

Referring to FIG. 5B, the first channel columns may be configured with first to fourth columns, and the second channel columns may be configured with first to fourth columns. In addition, the first channel columns or the second channel columns may be configured with four or more columns.

The select separation insulating layer SS may overlap with dummy plugs DP as shown in FIG. 5B. The dummy plugs DP may be arranged in a line along the extending direction of the select separation insulating layer SS. The dummy plugs DP may be formed using a process of forming the pillar parts PP.

Figure 6A:
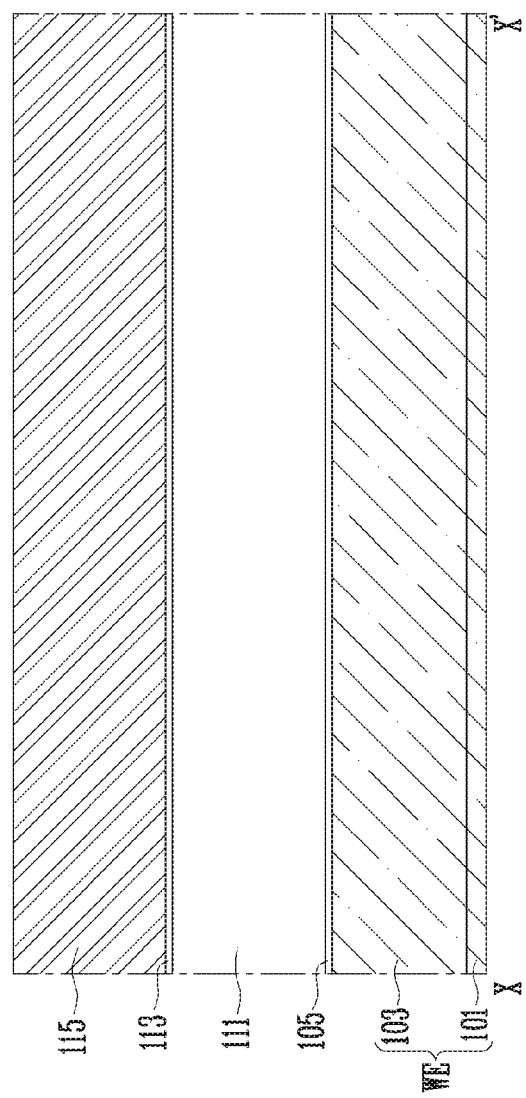
FIGS. 6A to 6N show sectional views illustrating processes included in a manufacturing method of a semiconductor device, according to an embodiment of the present disclosure.

FIGS. 6A to 6N show sectional views illustrating processes included in a manufacturing method of a semiconductor device according to an embodiment of the present disclosure. More specifically, FIGS. 6A to 6N show sectional views illustrating processes performed before a process of forming a spacer insulating layer is performed.

The processes shown by FIGS. 6A to 6N may be used to manufacture the semiconductor device shown in FIGS. 1A, 2A, and 3A or to manufacture the semiconductor device shown in FIGS. 1B, 2B, and 3B. FIGS. 6A to 6N illustrate sectional views taken along lines X-X' and Y-Y' shown in FIG. 5A. The semiconductor device shown in FIG. 5B may also be manufactured using the processes shown in FIGS. 6A to 6N.

Although not shown in the drawings, before the process shown in FIG. 6A is performed, driving transistors constituting a driving circuit for driving the semiconductor device may be formed on a substrate. The process shown in FIG. 6A may be performed on a substrate (not shown) including driving transistors.

Referring to FIG. 6A, a well structure WE including a dopant of a first conductivity type is formed on the substrate (not shown). The process of forming the well structure WE may include a process of forming a first doped semiconductor layer 101 and a process of forming a second doped semiconductor layer 103 on the first doped semiconductor layer 101. The first doped semiconductor layer 101 includes the dopant of the first conductivity type with a first concentration and the second doped semiconductor layer 103 includes the dopant of the first conductivity type with a second concentration. The first doped semiconductor layer 101 and the second doped semiconductor layer 103 may be doped silicon layers. The process of forming the second doped semiconductor layer 103 may include a process of forming an undoped silicon layer on the first doped semiconductor layer 101 and a process of diffusing the dopant of the first conductivity type in the first doped semiconductor layer 101 into the updoped silicon layer, using a heat treatment process.

Subsequently, a first protective layer 105 may be further formed on the well structure WE. The first protective layer 105 may be formed of a material different from that of a first sacrificial layer 111 formed in a subsequent process. For example, the first protective layer 105 may be formed of an oxide layer.

Subsequently, the first sacrificial layer 111 may be formed on the first protective layer 105, and an etch stop layer 115 may be formed on the first sacrificial layer 111. Before the etch stop layer 115 is formed, a second protective layer 113 may be formed on the first sacrificial layer 111. The etch stop layer 115 is formed on the second protective layer 113.

The first sacrificial layer 111 and the etch stop layer 115 may be formed of materials having different etching rates. The etch stop layer 115 may be used as a gate electrode, and may be formed of a material having etching resistivity in a subsequent etching process for forming a slit. For example, the first sacrificial layer 111 may be formed of an undoped silicon layer. The etch stop layer 115 may be formed of a doped silicon layer. More specifically, the etch stop layer 115 may be formed of a doped silicon layer including an n-type dopant.

The second protective layer 113 may be formed of a material different from those of the first sacrificial layer 111 and the etch stop layer 115. For example, the second protective layer 113 may be formed of an oxide layer.

Figure 6B:
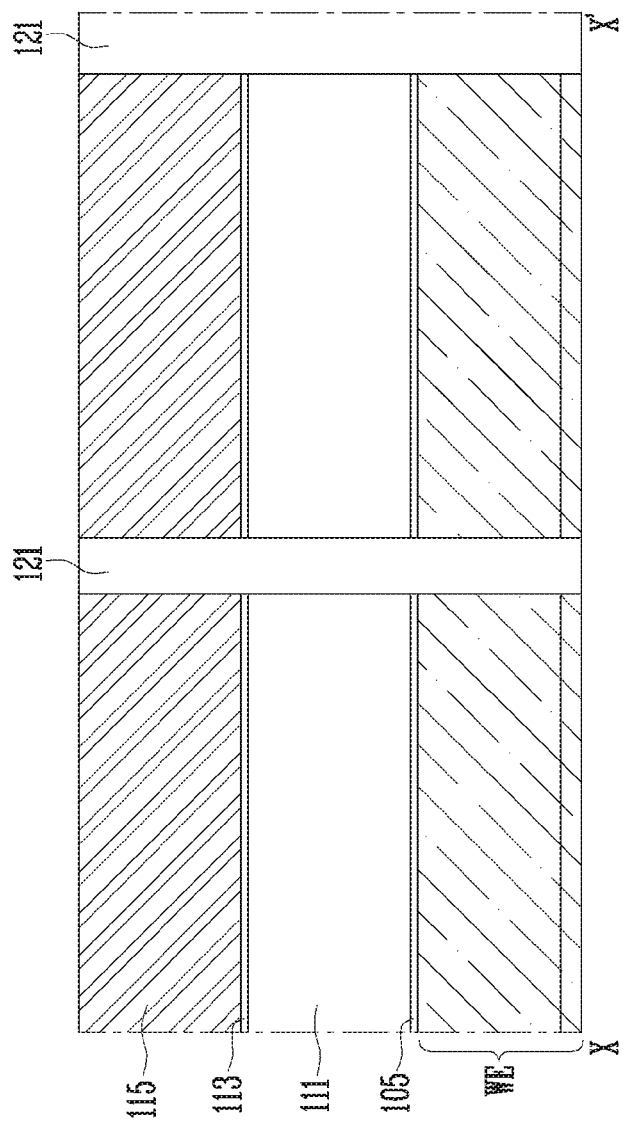

Referring to FIG. 6B, supports 121 penetrating the well structure WE from the etch stop layer 115 may be formed. The supports 121 are disposed to be spaced apart from each other. The process of forming the supports 121 may include a process of forming a mask pattern, using a photolithography process, a process of forming through holes by etching the etch stop layer 115, the second protective layer 113, the first sacrificial layer 111, the first protective layer 105, and the well structure WE through an etching process using the mask pattern as an etching barrier, a process of filling an insulating material in the through holes, a process of planarizing a surface of the insulating material, and a process of removing the remaining mask pattern. Oxide may be used as the insulating material for forming the supports 121.

Figure 6C:
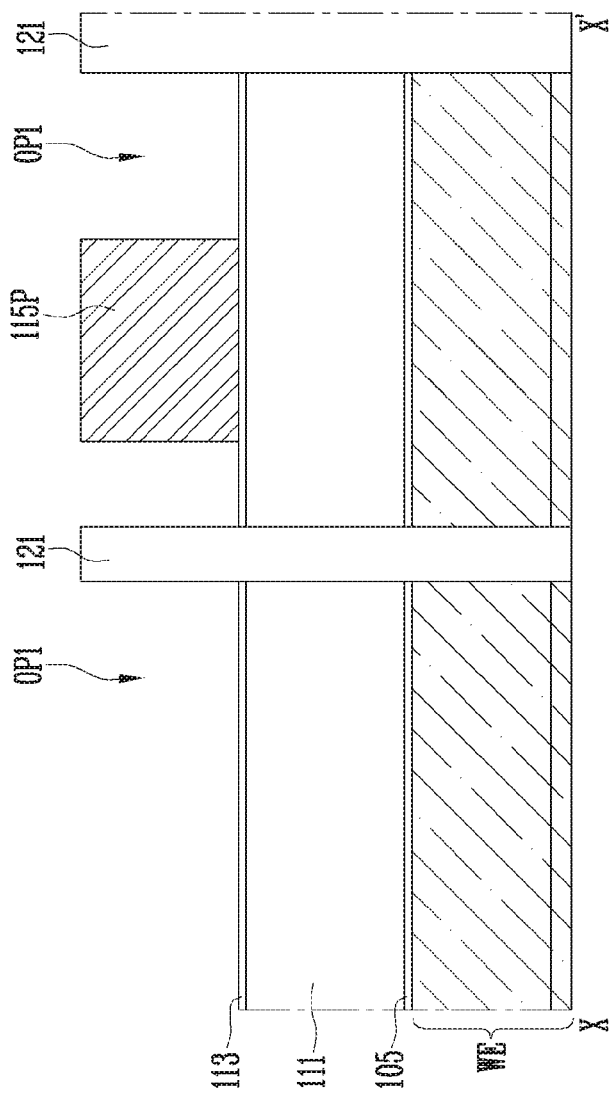

Referring to FIG. 6C, an etch stop pattern 115P may be formed by etching the etch stop layer 115 shown in FIG. 6B, which is penetrated by the supports 121. The process of forming the etch stop pattern 115P may include a process of forming a mask pattern, using a photolithography process, a process of etching the etch stop layer 115 shown in FIG. 6B through an etching process using the mask pattern as an etching barrier, and a process of removing the remaining mask pattern. A region in which the etch stop layer is removed in the process of forming the etch stop pattern 115P is defined as a first opening OP1. The first opening OP1 may expose the supports 121 and the second protective layer 113.

Figure 6D:
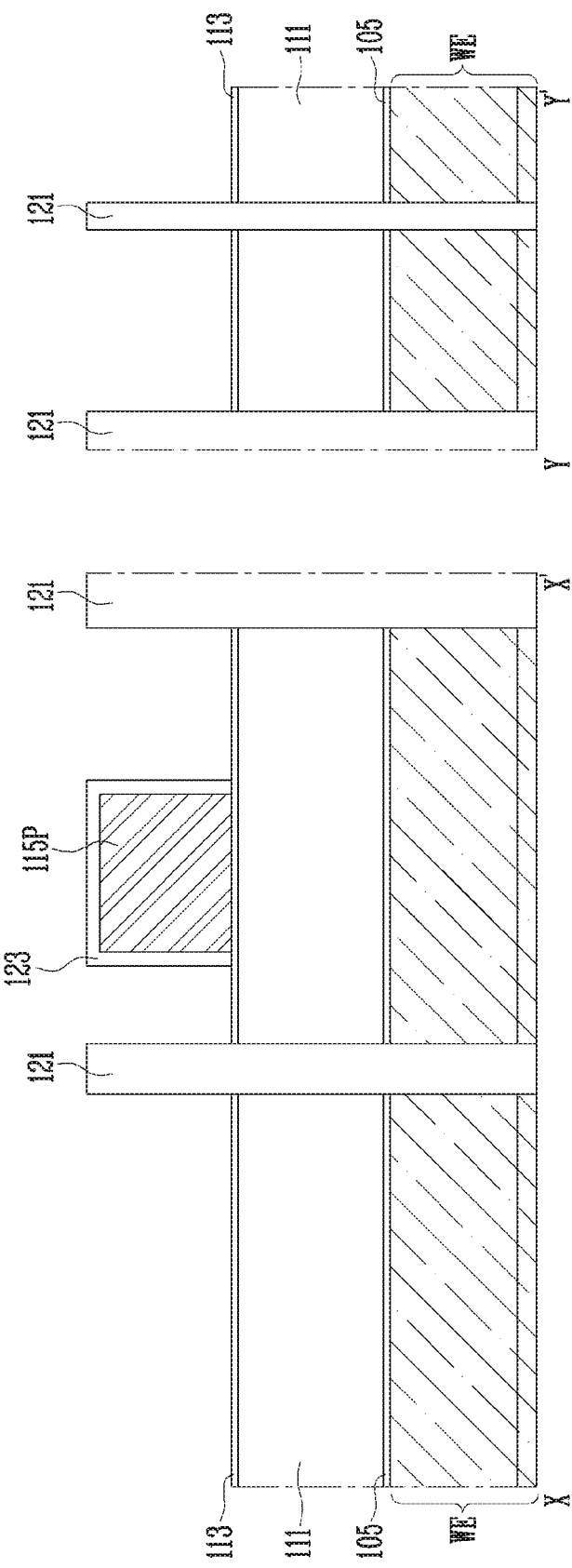

Referring to FIG. 6D, a third protective layer 123 may be formed on a surface of the etch stop pattern 115P. The third protective layer 123 may be formed by oxidizing the surface of the etch stop pattern 115P.

Figure 6E:
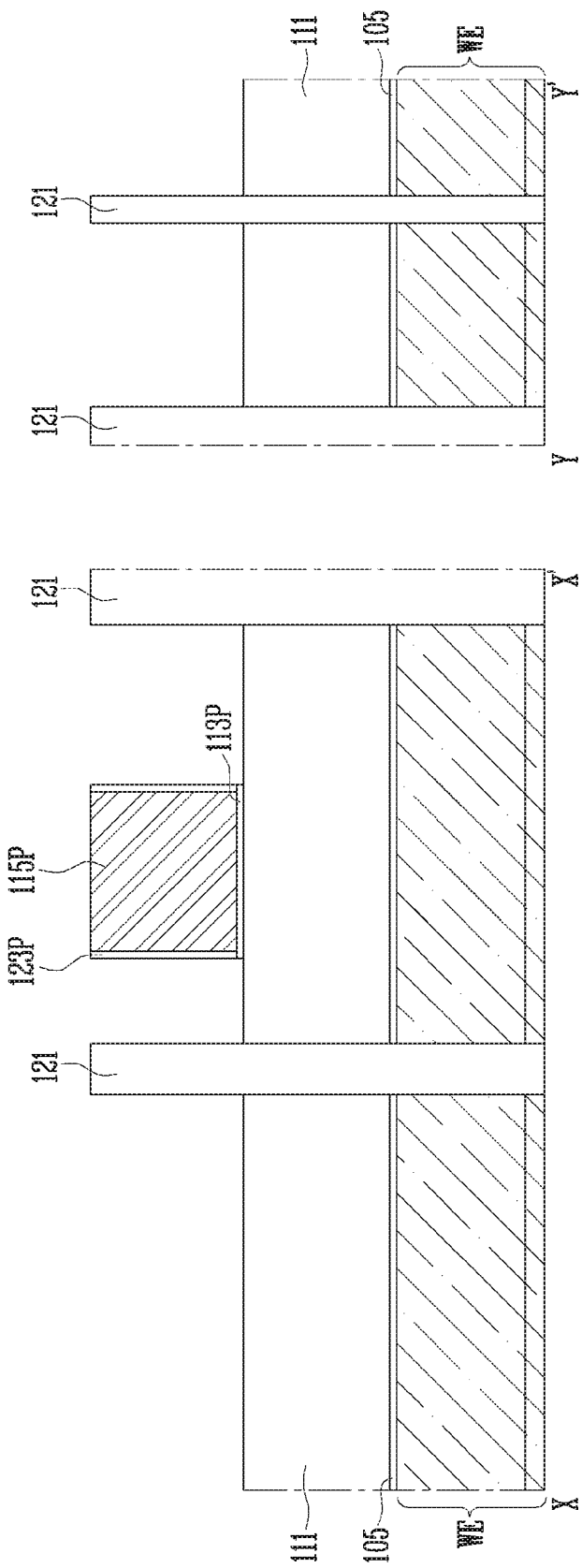

Referring to FIG. 6E, an etch-back process may be performed such that a portion of the third protective layer 123 shown in FIG. 6D and a portion of the second protective layer 113 can be removed. By the etch-back process, the third protective layer may remain as a third protective pattern 123P on a sidewall of the etch stop pattern 115P, and the second protective layer may remain as a second protective pattern 113P under the etch stop pattern 115P. A portion of the second protective layer, which is not protected by the etch stop pattern 115P, may be removed such that the first sacrificial layer 111 is exposed.

Figure 6F:
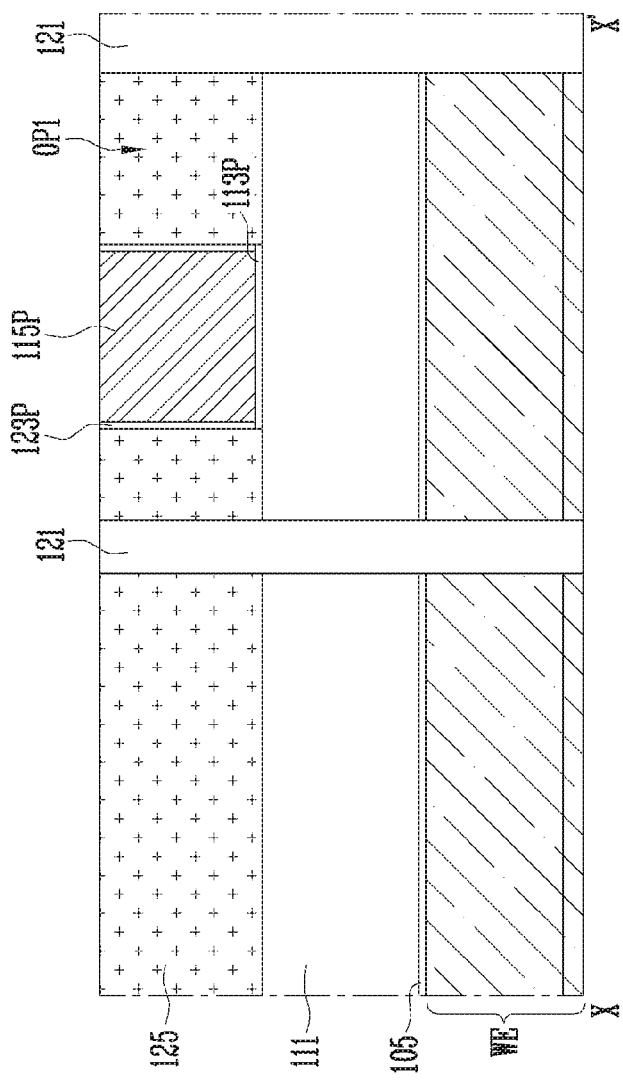

Referring to FIG. 6F, a second sacrificial layer 125 filling in the first opening OP1 is formed on the first sacrificial layer 111. The second sacrificial layer 125 may be formed of a material different from that of the first sacrificial layer 111. The second sacrificial layer 125 may be formed of a material having an etching rate different from those of first and second material layers of a stack structure to be formed in a subsequent process. For example, the second sacrificial layer 125 may include a titanium nitride layer (TiN). A surface of the second sacrificial layer 125 may be planarized until the etch stop pattern 115P is exposed.

As the processes described in FIGS. 6A to 6F are sequentially performed, the second sacrificial layer 125 penetrated by the eth stop pattern 115P may be formed on the first sacrificial layer 111. The etch stop pattern 115P has a bottom surface protected by the second protective pattern 113P and a sidewall protected by the third protective pattern 123P.

Figure 6G:
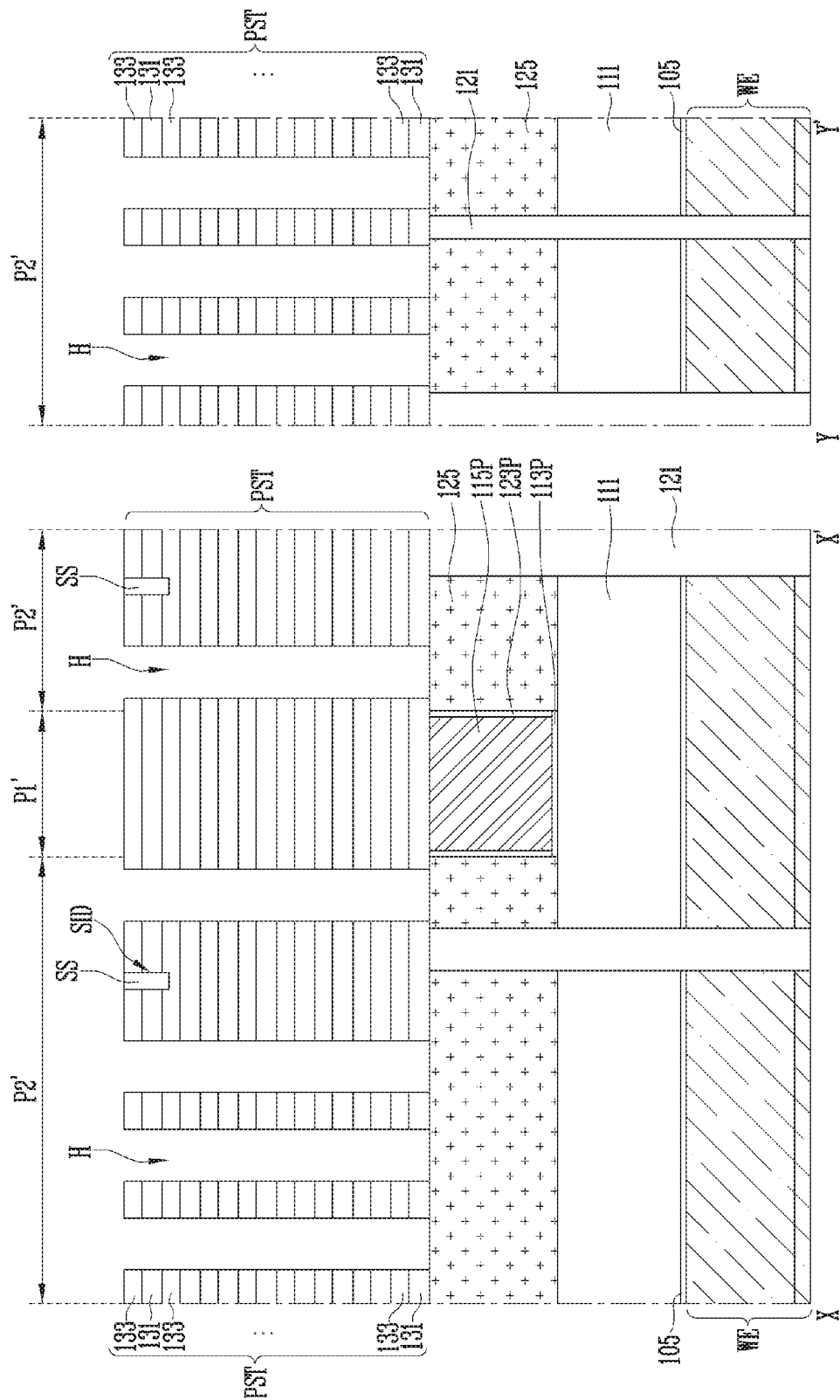

Referring to FIG. 6G, a stack structure PST is formed by alternately stacking first material layers 131 and second material layers 133 along a first direction I on the etch stop pattern 115P and the second sacrificial layer 125. The stack structure PST may include a first region P1' overlapping with the etch stop pattern 115P and a second region P2' that extends from the first region P1' and does not overlap with the etch stop pattern 115P.

The second material layers 133 are formed of a material different from that of the first material layers 131. The first material layers 131 may be formed of an insulating material for sacrificial layers, and the second material layers 133 may be formed of an insulating material for interlayer insulating layers. More specifically, the first material layers 131 may be formed of a silicon nitride layer, and the second material layers 133 may be formed of a silicon oxide layer.

Although not shown in the drawing, the first material layers 131 may be formed of a conductive material for the horizontal conductive patterns CP1 to CPk shown in FIGS. 1A and 1B, and the second material layers 133 may be formed of an insulating material for interlayer insulating layers. The first material layers 131 may be formed of a material different from that of the etch stop pattern 115P. For example, the first material layers 131 may include at least one of a metal silicide layer and a metal layer. The first material layers 131 may be formed of a conductive material having a resistance lower than that of the etch stop pattern 115P. For example, the first material layers 131 may include tungsten.

Some of the first material layers 131 and the second material layers 133 may be penetrated by a select separation slit SID. The select separation slit SID may be filled with a select separation insulating layer SS. The select separation insulating layer SS is formed to separate drain select lines from each other, and the depth where the select separation insulating layer SS is formed may be variously modified. The select separation slit SID and the select separation insulating layer SS may be omitted if necessary.

Subsequently, holes H may be formed to expose the second sacrificial layer 125 by penetrating the second region P2' of the stack structure PST. The first material layers 131 and the second material layers 133 may be etched to form the holes H. When the second sacrificial layer 125 is formed of a material including a metal such as TiN, the width of a bottom surface of each of the holes H can be widely secured using a difference in etching rate between the stack structure PST and the metal-based second sacrificial layer 125.

Figure 6H:
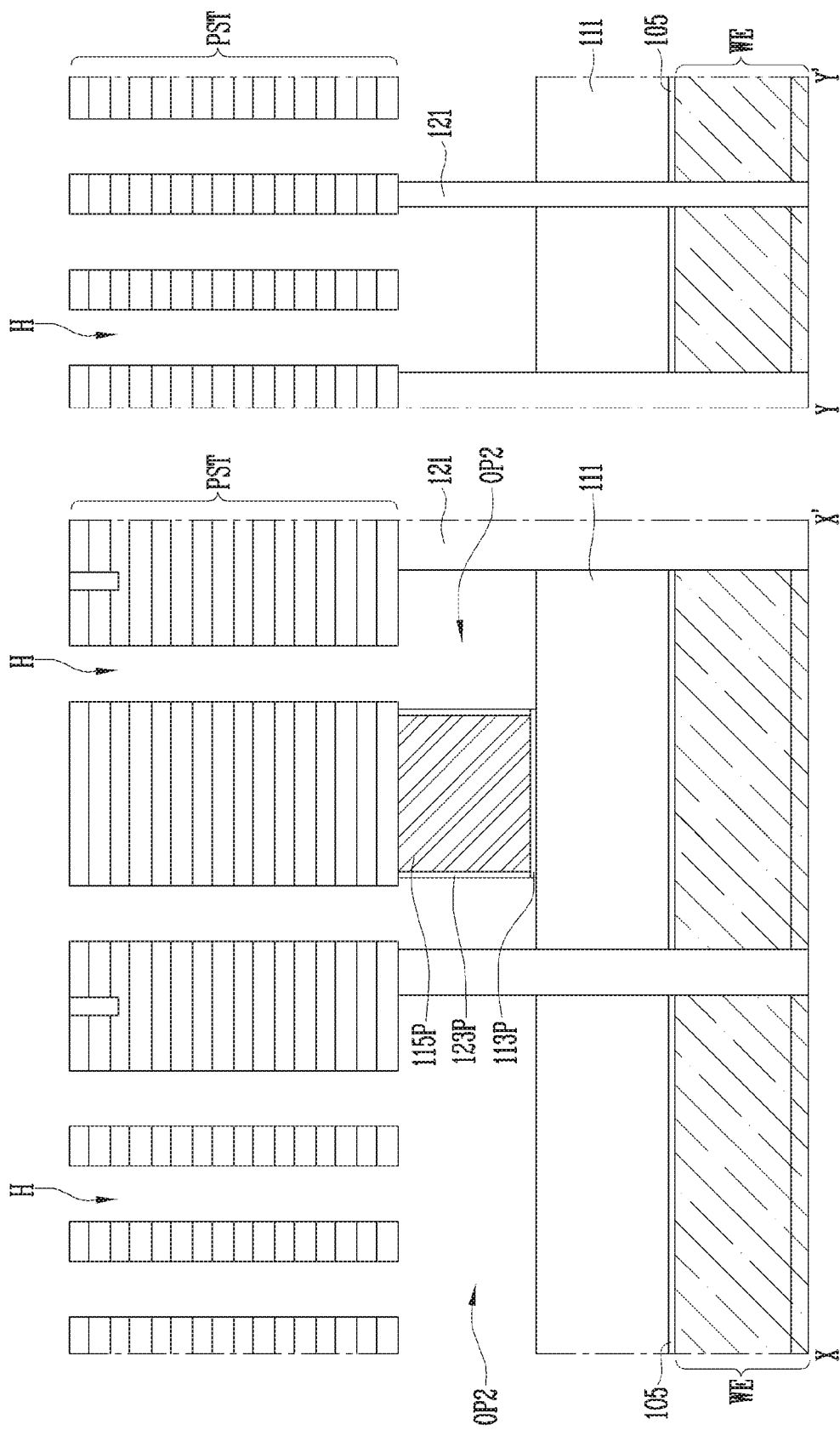

Referring to FIG. 6H, the second sacrificial layer 125 shown in FIG. 6G is selectively removed through the holes H. Accordingly, the first sacrificial layer 111 and the third protective pattern 123P are exposed, and a second opening OP2 connected to the holes H is defined between the stack structure PST and the first sacrificial layer 111.

Referring to FIG. 6I, the first sacrificial layer 111 shown in FIG. 6H is selectively removed through the holes H and the second opening OP2. Accordingly, a horizontal space HSP is opened, which is connected to the holes H to extend between the stack structure PST and the well structure WE and between the etch stop pattern 115P and the well structure WE. The horizontal space HSP may include the second opening OP2 defined in the region in which the second sacrificial layer is removed and a third opening OP3 defined in the region in which the first sacrificial layer is removed.

In the above, while the horizontal space HSP is being opened, the etch stop pattern 115P can be protected by the second protective pattern 113P and the third protective pattern 123P without loss. While the horizontal space HSP is being opened, the well structure WE can be protected by the first protective layer 105 without loss. The stack structure PST may be supported by the supports 121, so that the gap of the horizontal space HSP is can be maintained. The etch stop pattern 115P can be maintained without being collapsed by adhesive power where it is adhered to the stack structure PST.

Through the series of processes described in FIGS. 6A to 6I, an opening region including the horizontal space HSP and the holes H. The horizontal space HSP is formed between the well structure WE and the stack structure PST and is maintained by the supports 121 supporting the stack structure PST. The holes H extend to penetrate the stack structure PST from the horizontal space HSP.

Figure 6J:
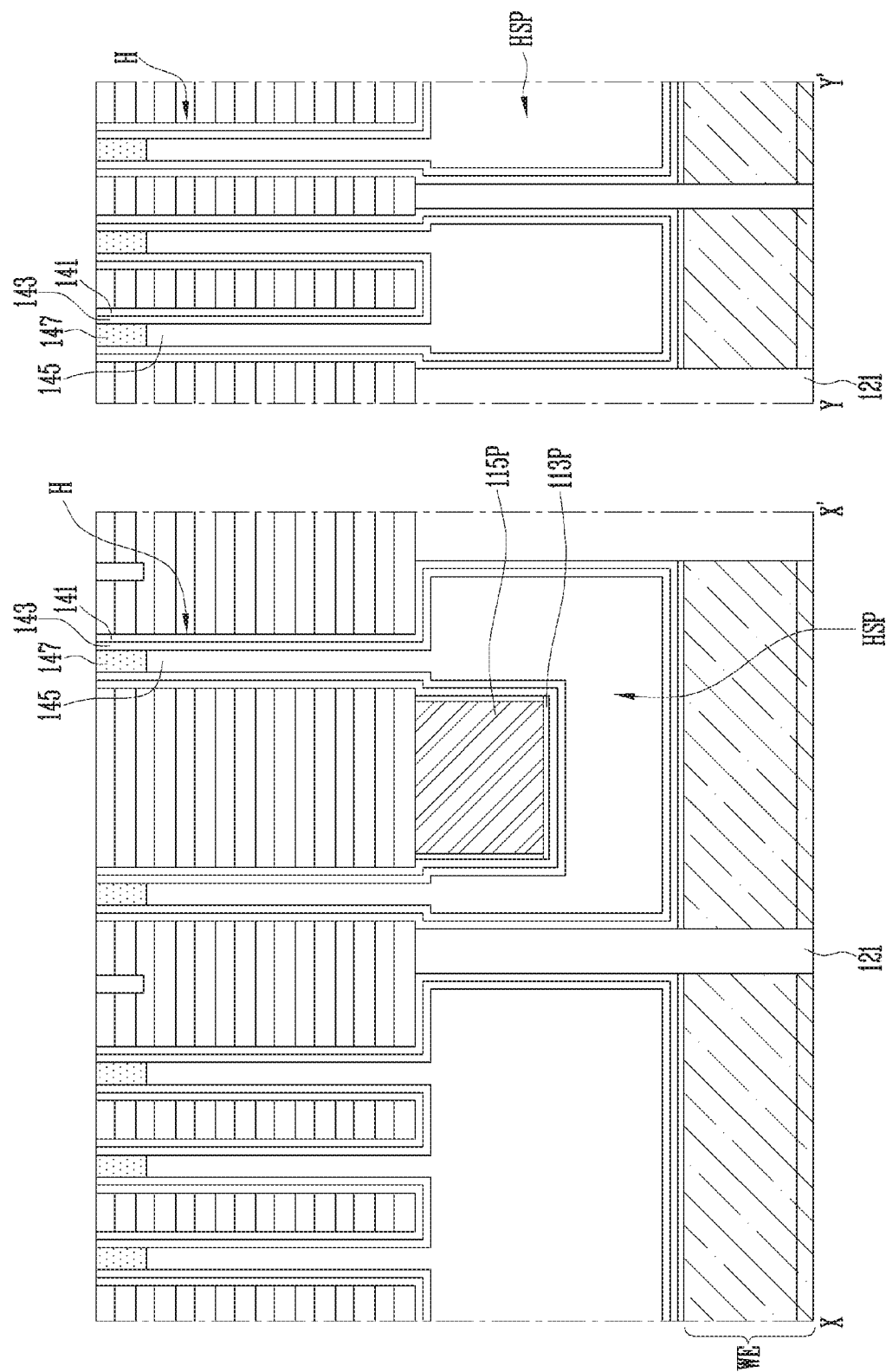

Referring to FIG. 6J, a multi-layered memory layer 141 extending along a surface of the opening region including the holes H and the horizontal space HSP, surfaces of the supports 121, and a surface of the etch stop pattern 115P may be formed on the surface of the opening region. The process of forming the multi-layered memory layer 141 may include a process of forming a first blocking insulating layer, a process of forming a data storage layer on the first blocking insulating layer, and a process of forming a tunnel insulating layer on the data storage layer. Each of the first blocking insulating layer, the data storage layer, and the tunnel insulating layer may be formed of the same material as described in FIGS. 2A, 2B, 3A, and 3B.

Subsequently, a channel layer 143 is formed on a surface of the multi-layered memory layer 141. The channel layer 143 may extend along the surface of the opening region including the holes H and the horizontal space HSP, the surfaces of the supports 121, and the surface of the etch stop pattern 115P, and be surrounded by the multi-layered layer 141.

The channel layer 143 may be formed of a semiconductor layer. For example, the channel layer 143 may be formed by depositing a silicon layer. The channel layer 143 may be formed as an integrated layer without any boundary surface.

Subsequently, each of the holes H and the horizontal space HSP, which are not filled with the channel layer 143 but opened, is filled with a gap fill insulating layer 145. The gap fill insulating layer 145 is surrounded by the channel layer 143. The gap fill insulating layer 145 may be formed of various insulating materials. For example, the process of forming the gap fill insulating layer 145 may include a process of filling the holes H and the horizontal space HSP with a material layer having liquidity and a process of curing the material layer having liquidity. Polysilazane (PSZ) may be used as the material layer having liquidity.

A process of allowing a portion of the gap fill insulating layer 145 to be recessed may be further performed such that the height of the gap fill insulating layer 145 is lower than that of the channel layer 143. A central region of the channel layer 143 exposed on the gap fill insulating layer 145 may be filled with a capping pattern 147. The capping pattern 147 may be formed of a doped silicon layer including a dopant of a second conductivity type.

Figure 6K:
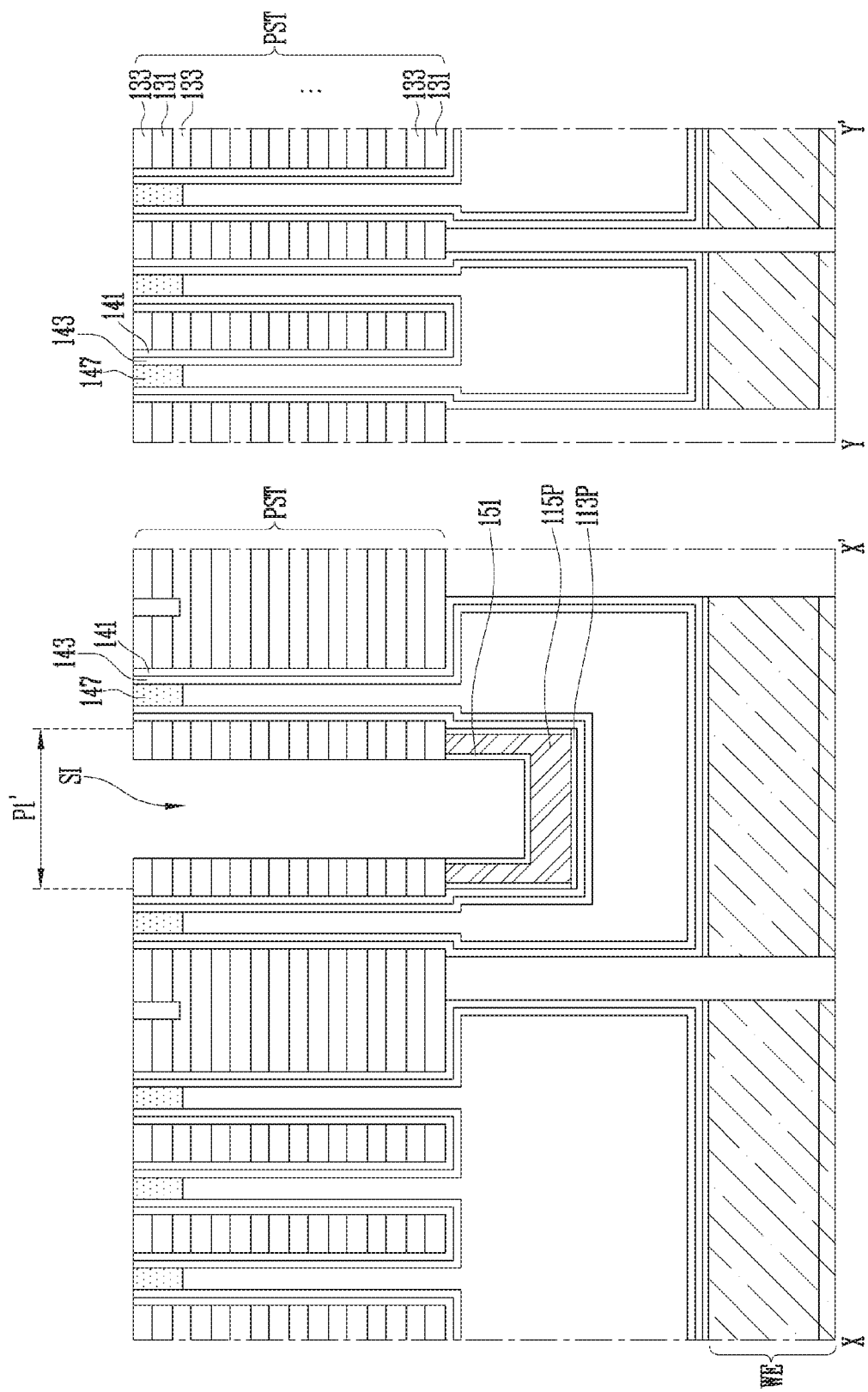

Referring to FIG. 6K, a slit SI exposing sidewalls of the first material layers 131 and the second material layers 133 is formed by etching the first material layers 131 and the second material layers 133, which are disposed in the first region P1' of the stack structure PST, through a first etching process. The etch stop pattern 115P is in a state in which it is formed of a material different from those of the first material layers 131 and the second material layers 133 by considering etching rates of the first material layers 131 and the second material layers 133. Accordingly, the first etching process may be stopped before the etch stop pattern 115P having etching resistivity with respect to an etching material for etching the first material layers 131 and the second material layers 133 is completely penetrated. In other words, the depth of the slit SI formed through the first etching process may be uniformly controlled such that the slit SI penetrates the stack structure PST but does not penetrate the etch stop pattern 115P.

The width of the slit SI is formed narrower than that of the etch stop pattern 115P. Accordingly, the etch stop pattern 115P may remain at both sides of the slit SI. After the slit SI is formed, a fourth protective layer 151 may be formed by oxidizing the surface of the etch stop pattern 115P exposed through the slit SI.

When the first material layers 131 are formed of a conductive material for conductive patterns, the stack structure PST may be separated into the gate stack structures GST1 and GST2 described in FIG. 1A or 1B by the slit SI penetrating the first material layers 131 and the second material layers 133.

Figure 6L:
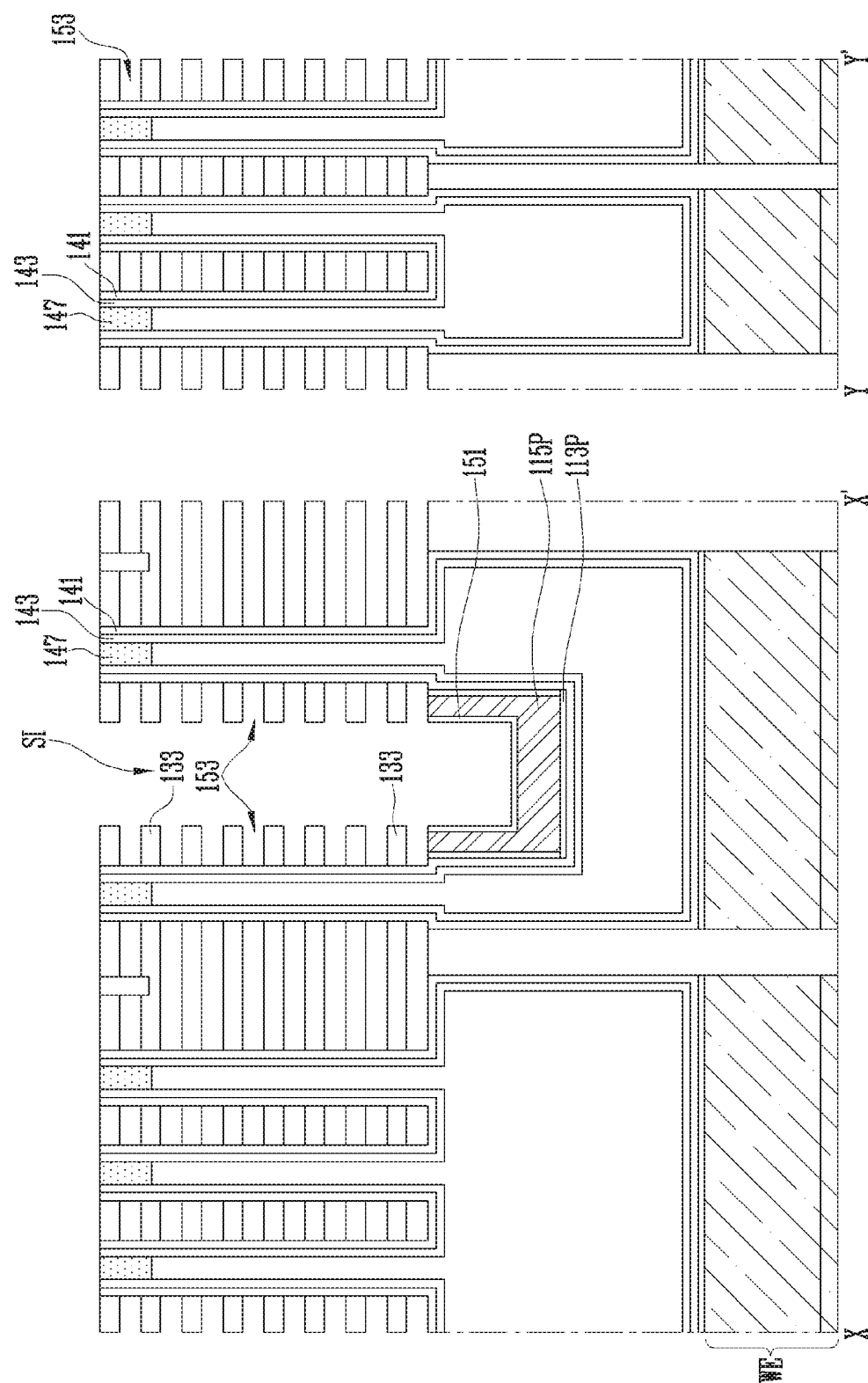
Figure 6M:
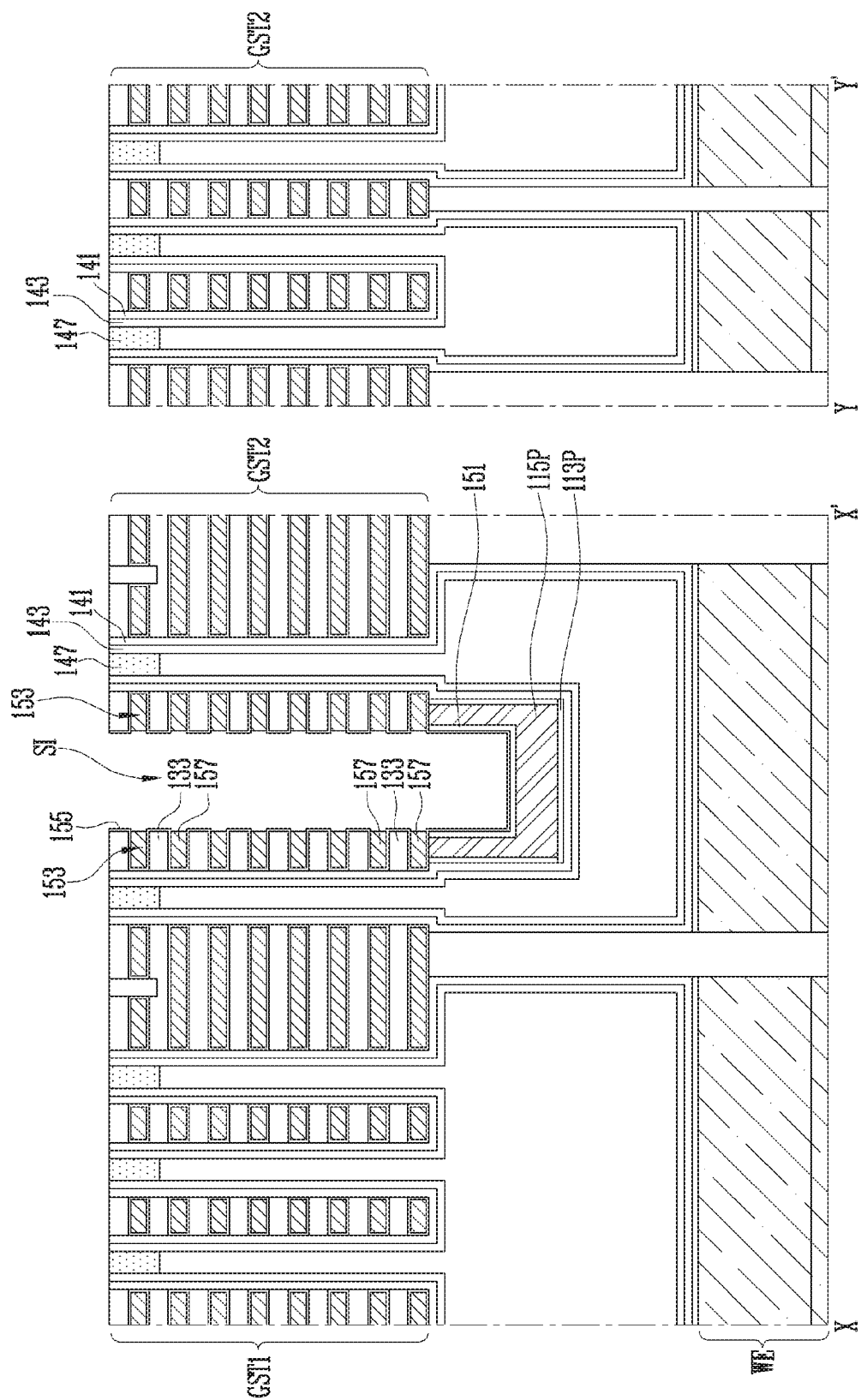
Figure 6M:
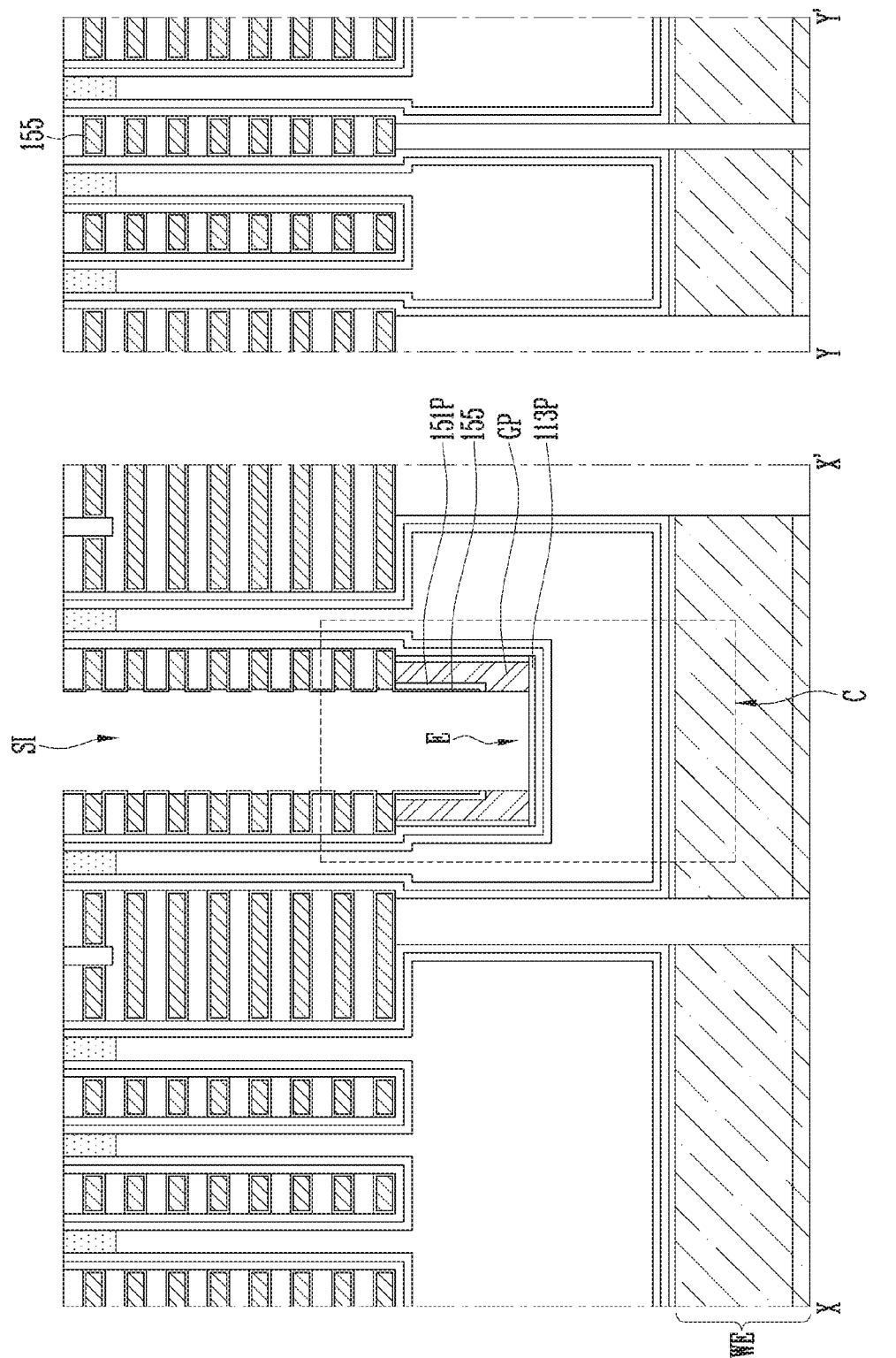

When the first material layers 131 are formed of an insulating material for sacrificial layers and the second material layers 133 are formed of an insulating material for interlayer insulating layers, processes shown in FIGS. 6L and 6M may be further performed.

Referring to FIG. 6L, a process of selectively removing the first material layers 131 shown in FIG. 6K through the slit SI may be performed. Accordingly, gate regions 153 are opened.

Referring to FIG. 6M, horizontal conductive patterns 157 may be formed in the gate regions 153. The process of forming the horizontal conductive patterns 157 may include a process of forming a second blocking insulating layer 155 along surfaces of the gate regions 153 and the slit SI, a process of forming a third material layer having conductivity on the second blocking insulating layer 155, and a process of separating the third material layer into the horizontal conductive patterns 157 by removing the third material layer. The third material layer may be a metal layer having a resistance lower than that of the etch stop pattern 115P. The fourth protective layer 151 may protect the etch stop pattern 115P while the process of opening the gate regions 153 by removing the first material layers and the process of removing the third material layer in the slit SI are being performed.

As described above, the gate stack structures GST1 and GST2 may be formed using various processes.

Referring to FIG. 6N, the slit SI extends to penetrate the etch stop pattern 115P by etching the etch stop pattern 115P shown in FIG. 6M through a second etching process. The etch stop pattern 115P may be separated into source gate patterns GP by an extension part E of the slit SI. The fourth protective layer 151 shown in FIG. 6M may remain as a fourth protective pattern 151P on a sidewall of each of the source gate patterns GP. The second protective pattern 113P may be exposed by the extension part E of the slit SI. Hereinafter, the extension part E is defined as a portion of the slit SI.

FIGS. 7A to 7G show sectional views illustrating an embodiment of subsequent processes continued after the process shown in FIG. 6N. The sectional views shown in FIGS. 7A to 7G correspond to region C shown in FIG. 6N. The processes shown in FIGS. 7A to 7G may be used to manufacture the semiconductor device shown in FIGS. 1A and 2A.

Figure 7A:
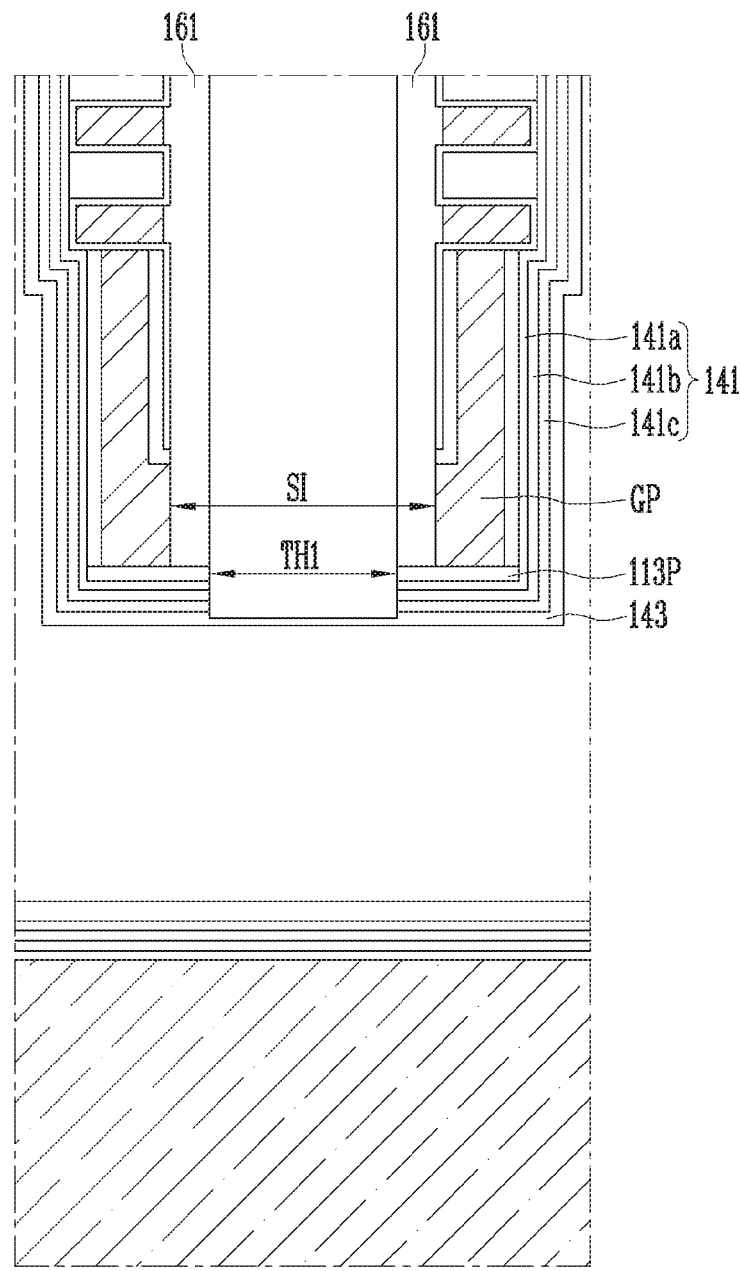
FIGS. 7A to 7G show sectional views illustrating an embodiment of subsequent processes continued after the process shown in FIG. 6N.

Referring to FIG. 7A, spacer insulating layers 161 are formed on sidewalls of the slit SI. The slit SI extends up to a space between the source gate patterns GP, and hence the spacer insulating layers 161 may extend to cover sidewalls of the source gate patterns GP.

The process of forming the spacer insulating layers 161 may include a process of depositing an insulating layer along the surface of the slit SI and a process of etching the insulating layer through an etch-back process. While the insulating layer is being etched, the second protective pattern 113P and a first blocking insulating layer 141a, a data storage layer 141b, and a tunnel insulating layer 141c of the multi-layered memory layer 141, which are exposed through a bottom surface of the slit SI, may be etched, and the channel layer 143 may be exposed. Accordingly, a first through part TH1 is formed, which penetrates the second protective pattern 113P and the multi-layered memory layer 141, exposes the channel layer 143, and is connected to the slit SI.

Figure 7B:
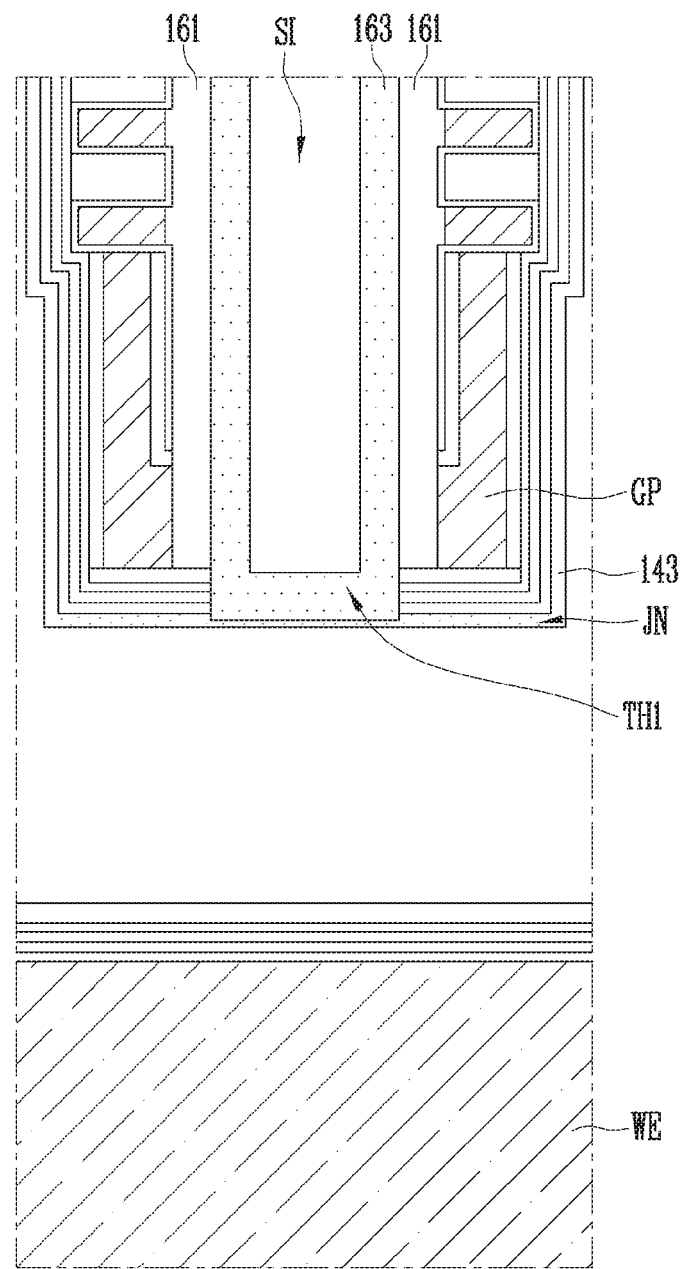

Referring to FIG. 7B, a doped semiconductor layer 163 is formed to extend on a surface of the channel layer 143 exposed through the first through part TH1 and surfaces of the spacer insulating layers 161. The doped semiconductor layer 163 may be a doped silicon layer including a dopant of the second conductivity type. The dopant of the second conductivity type may have a conductivity type opposite to that of the dopant of the first conductivity type in the well structure WE. The dopant of the second conductivity type may be an n-type dopant, and the dopant of the first conductivity type may be a p-type dopant.

The doped semiconductor layer 163 is in direct contact with the surface of the channel layer 143, which defines a bottom surface of the first through part TH1, and extends on sidewalls of the spacer insulating layers 161 in the slit SI. The doped semiconductor layer 163 is conformally deposited, and a central region of the slit SI is opened in a state in which it is not filled with the doped semiconductor layer 163.

Subsequently, a thermal process for diffusing the dopant of the second conductivity type in the doped semiconductor layer 163 into the channel layer 143 may be performed. A source junction JN may be formed in the channel layer 143 through the thermal process.

The source gate pattern GP remains to be used as a source select line. Accordingly, although it is difficult to uniformly control the diffusion range of the dopant of the second conductivity type, the distance between the remaining source gate pattern GP and the source junction JN is short, and thus the turn-on current of the source select transistor can be increased. In other words, the turn-on current of the source select transistor can be stably secured through the remaining source gate pattern GP.

Figure 7C:
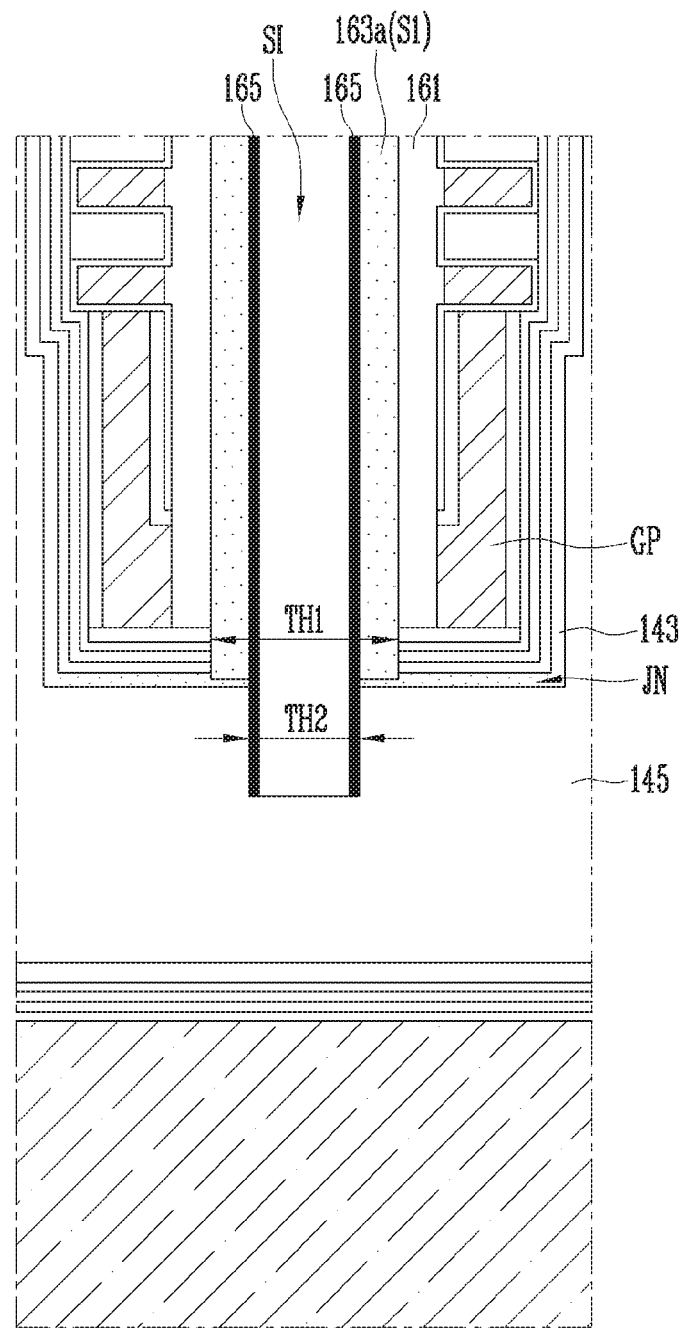

Referring to FIG. 7C, first source contact patterns S1 are formed by patterning the doped semiconductor layer 163 shown in FIG. 7B. The first source contact patterns S1 are doped semiconductor layers 163a that are penetrated by a second through part TH2 and remain on sidewalls of the slit SI. Each of the doped semiconductor layers 163a is in contact with the channel layer 143 defining the bottom surface of the first through part TH1 to extend on the sidewalls of the spacer insulating layers 161.

The second through part TH2 is formed by etching the doped semiconductor layer 163 shown in FIG. 7B and the channel layer 143 between the doped semiconductor layer 163 and the gap fill insulating layer 145, and exposes the gap fill insulating layer 145. The second through part TH2 may penetrate the channel layer 143 and extend to the inside of the gap fill insulating layer 145.

Subsequently, fifth protective layers 165 are formed on sidewalls of the first source contact patterns S1 and cover sidewalls of the second through part TH2. The step of forming the fifth protective layers 165 may include a process of depositing a nitride layer and a process of etching the nitride layer through an etch-back process such that the gap fill insulating layer 145 is exposed through the second through part TH2. The fifth protective layers 165 may be formed of another material layer having an etching rate different from that of an oxide layer, in addition to the nitride layer.

Figure 7D:
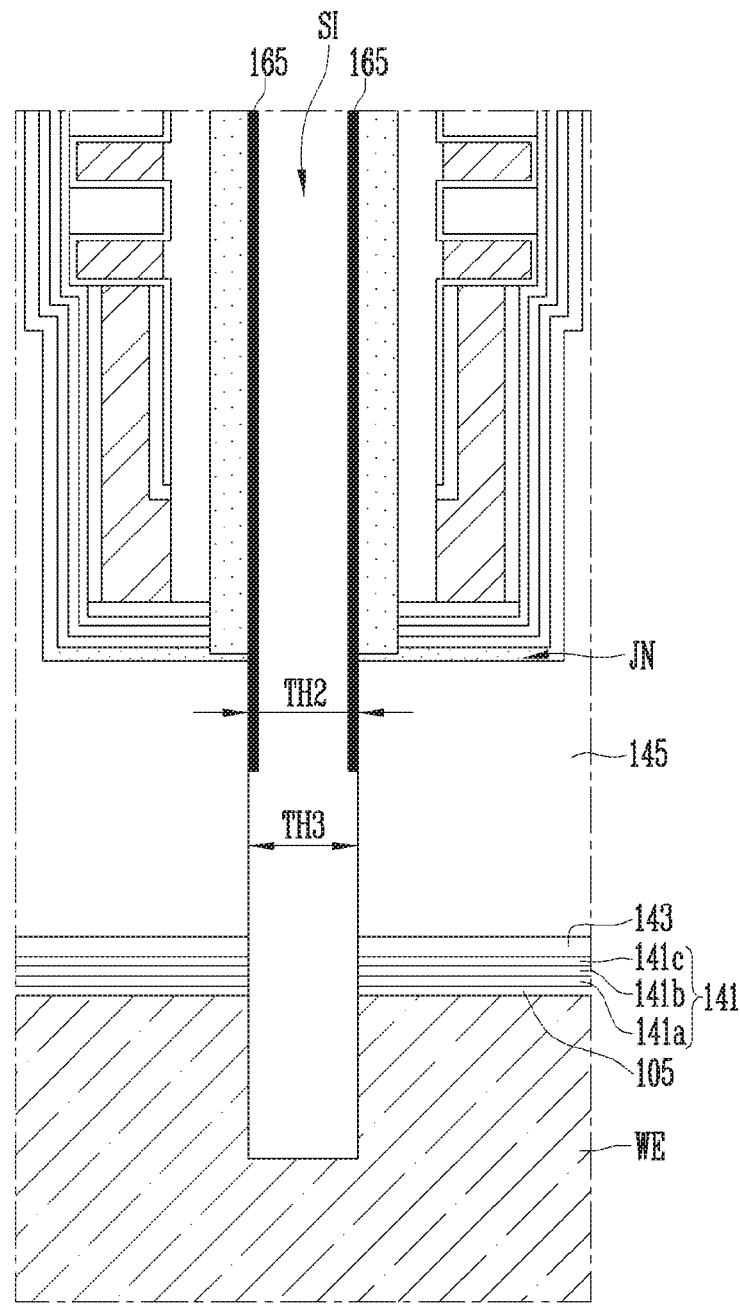

Referring to FIG. 7D, a third through part TH3 exposing the well structure WE is formed by etching the gap fill insulating layer 145, the channel layer 143, the multi-layered memory layer 141, and the first protective layer 105, which are exposed under the second through part TH2. Since the channel layer 143 that is disposed on the top of the gap fill layer 145 and includes the source junction JN is protected by the fifth protective layers 165, the channel layer 143 disposed on the top of the gap fill layer 145 is not etched.

The channel layer 143 may be separated into channel patterns CH as shown in FIG. 1A by the second through part TH2 and the third through part TH3, which are connected to the slit SI. The third through part TH3 may extend to the inside of the well structure WE.

Figure 7E:
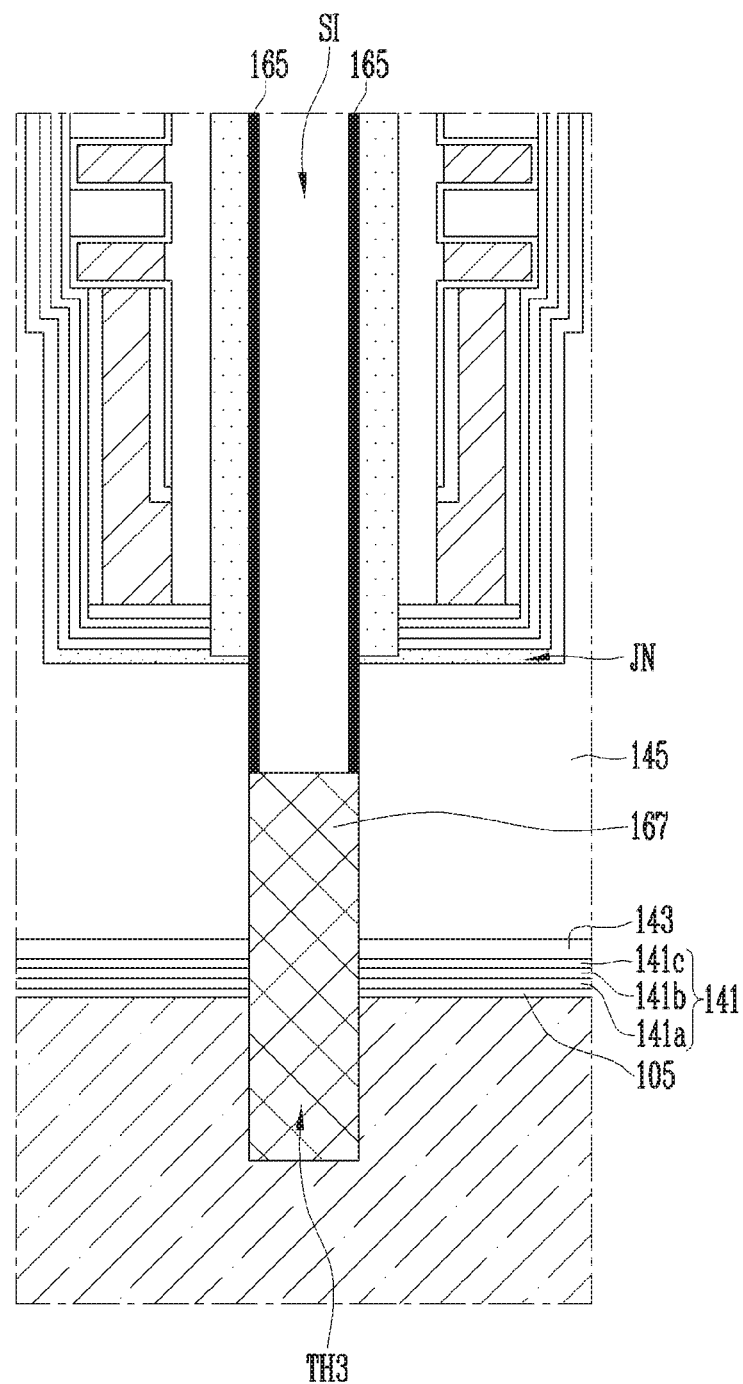

Referring to FIG. 7E, the third through part TH3 is filled with a well contact structure 167. The well contact structure 167 is in direct contact with the well structure WE and the channel layer 143. The well contact structure 167 may be formed of a semiconductor layer.

The process of forming the well contact structure 167 may include a process of allowing a silicon layer to be grown from the well structure WE and the channel layer 143, which are exposed through the third through part TH3. A portion of the channel layer 143, which is disposed on the top of the gap fill layer 145 and includes the source junction JN, is blocked by the fifth protective layers 165 while the well contact structure 167 is being grown. Thus, the well contact structure 167 is not connected to the source junction JN. The dopant of the first conductivity type in the well structure WE may be diffused into the well contact structure 167. The well contact structure 167 may be formed not by using a growth method but by using a deposition method.

Figure 7F:
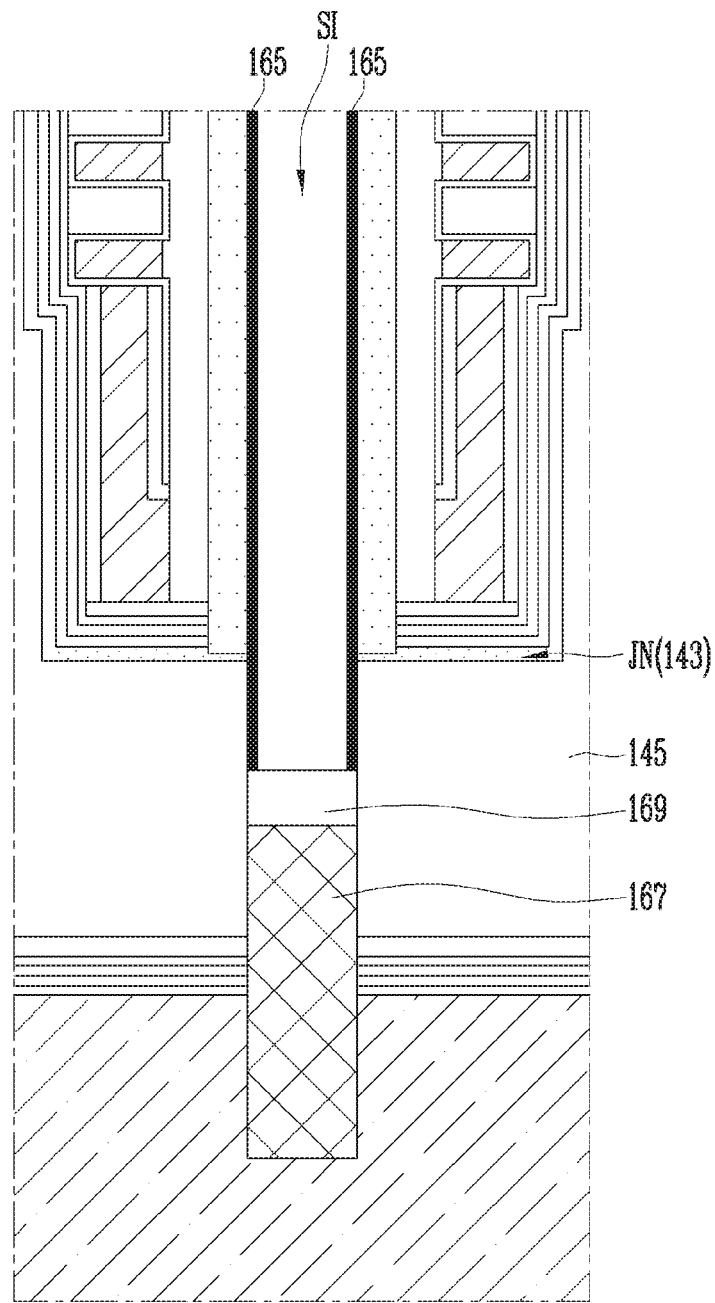

Referring to FIG. 7F, an inter-well-source insulating layer 169 may be formed by oxidizing an upper portion of the well contact structure 167 through the slit SI. Since the portion of the channel layer 143, which is disposed on the top of the gap fill layer 145 and includes the source junction JN, is blocked by the fifth protective layers 165 during the oxidizing process, the portion of the channel layer 143 is not oxidized.

Figure 7G:
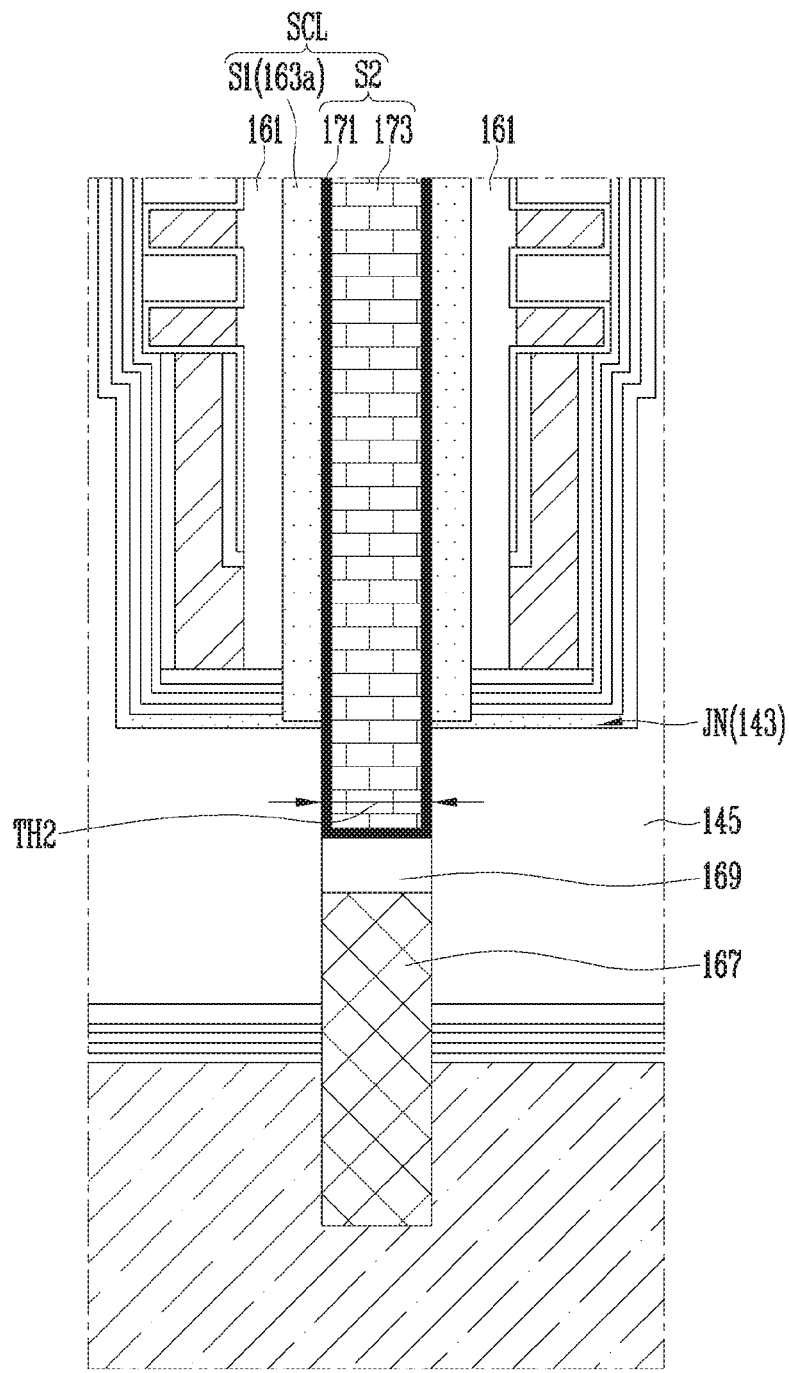

Referring to FIG. 7G, after the fifth protective layers 165 shown in FIG. 7F are removed, a second source contact pattern S2 is formed.

The inter-well-source insulating layer 169 has an etching rate different from that of the fifth protective layers 165, and hence loss of the inter-well-source insulating layer 169 can be minimized during the fifth protective layers 165 are being removed. The doped semiconductor layers 163a constituting the first source contact patterns S1 may be exposed due to the removal of the fifth protective layers 165. In addition, the portion of the channel layer 143, which is disposed on the top of the gap fill layer 145 and includes the source junction JN, is exposed due to the removal of the fifth protective layers 165.

The second source contact pattern S2 is formed on the inter-well-source insulating layer 169, and is formed to fill in a space between the first source contact patterns S1 and the second through part TH2. The process of forming the second source contact pattern S2 may include a process of forming a barrier metal layer 171 and a process of forming a metal layer 173 on the barrier metal layer 171. The barrier metal layer 171 is formed to cover a surface of the second through part TH2 and surfaces of the first source contact patterns S1. The metal layer 173 is formed to fill in the space between the first source contact patterns S1 and the second through-part TH2. The metal layer 173 may include tungsten such that the source contact structure SCL has a low resistance. In order to prevent diffusion of metal from the metal layer 173, the barrier metal layer 171 may include a titanium nitride layer, a tungsten nitride layer, a tantalum nitride layer, and the like.

Figure 8A:
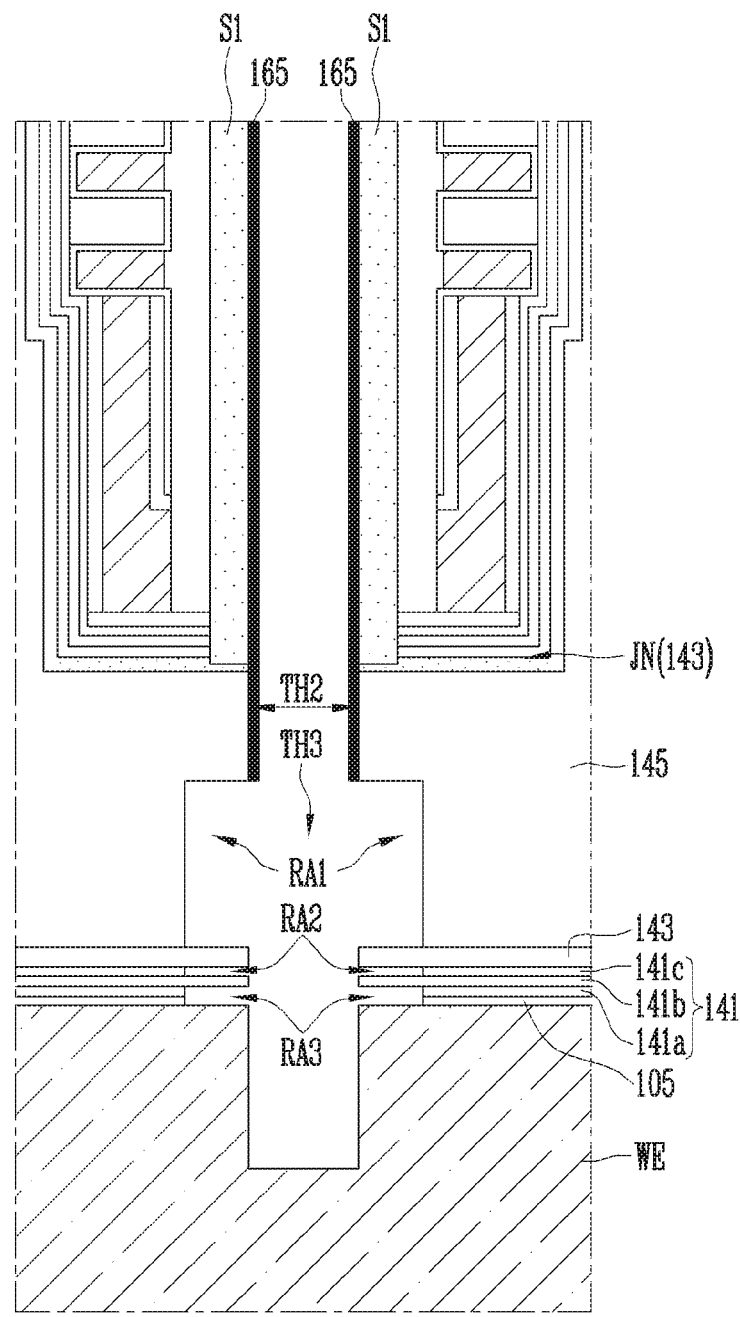
FIGS. 8A to 8C show sectional views illustrating an embodiment of subsequent processes continued after the process shown in FIG. 6N.
Figure 8B:
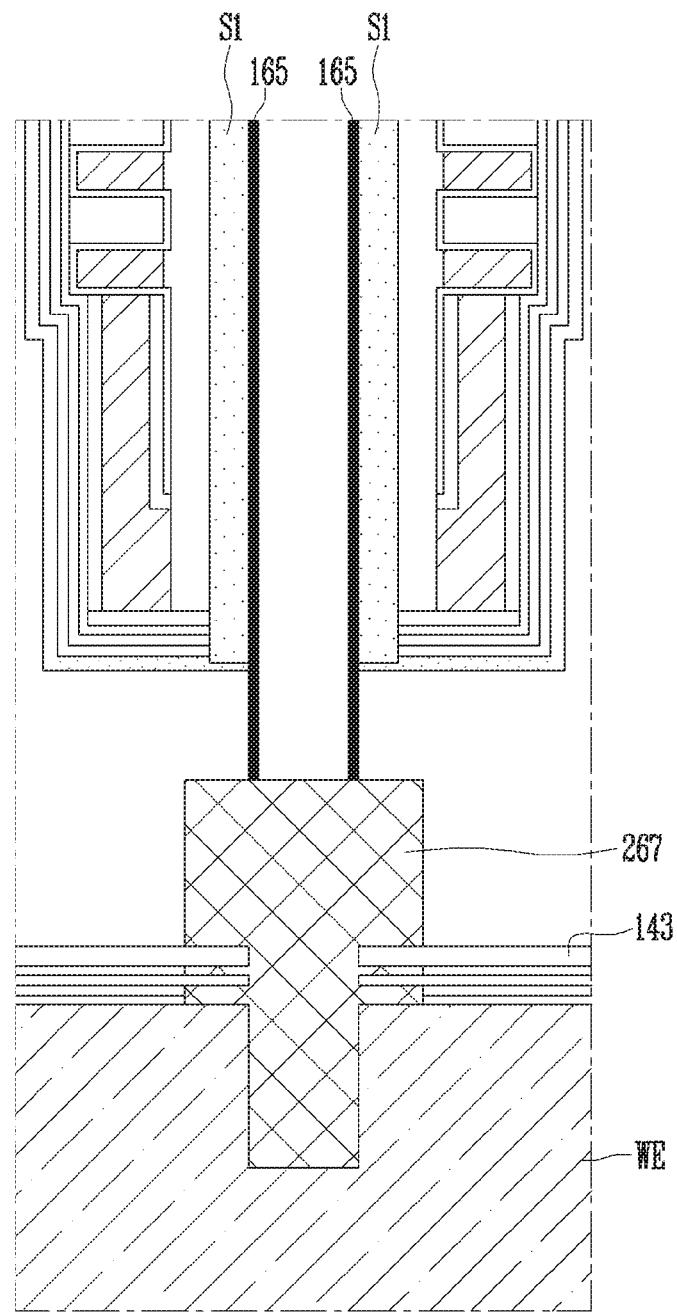
Figure 8C:
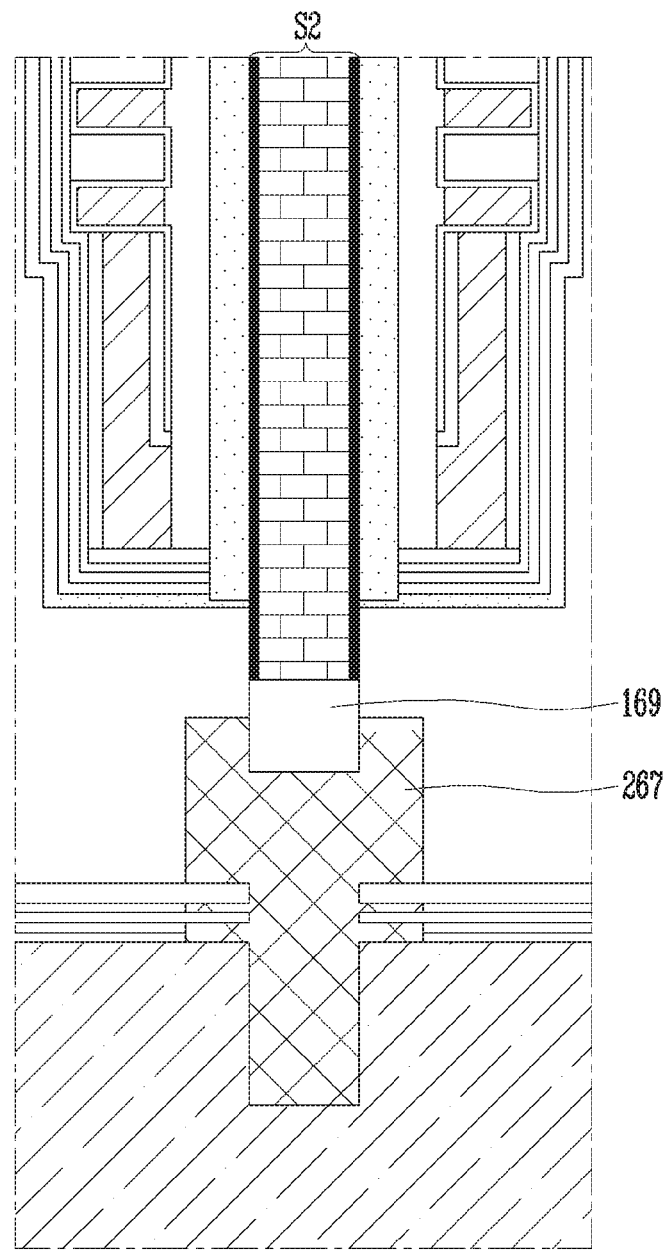

FIGS. 8A to 8C are sectional views illustrating an embodiment of the subsequent processes continued after the process shown in FIG. 6N. The sectional views shown in FIGS. 8A to 8C correspond to region C shown in FIG. 6N. The processes shown in FIGS. FIGS. 8A to 8C may be used to manufacture the semiconductor device shown in FIGS. 1B and 2B.

Referring to FIG. 8A, a structure is formed, in which the first source contact patterns S1, the source junction JN of the channel layer 143, and the sidewalls of the second through part TH2 are covered with the fifth protective layers 165. After the process shown in FIG. 6N, the structure may be formed using the processes described in FIGS. 7A to 7C.

Subsequently, a through part TH3 is formed through the same process described in FIG. 7D. Subsequently, the gap fill insulating layer 145 and the first blocking insulating layer 141a and the tunnel insulating layer 141c of the multi-layered memory layer 141, which are exposed through the third through part TH3, are selectively etched. The first protective layer 105 exposed through the third through part TH3 may also be etched. Accordingly, recess regions RA1 to RA3 are formed in a horizontal direction intersecting the third through part TH3. The gap fill layer 145, the first blocking insulating layer 141a, the tunnel insulating layer 141c, and the first protective layer 105 are formed of oxide, the data storage layer 141b is formed of nitride, and the channel layer 143 is formed of a semiconductor layer. The oxide may be etched with an etching rate higher than those of the nitride and the semiconductor layer. Accordingly, the data storage layer 141b and the channel layer 143 between the gap fill insulating layer 145 and the well structure WE can remain to protrude farther toward the third through part TH3 than the first blocking insulating layer 141a, the tunnel insulating layer 141c, and the first protective layer 105.

Referring to FIG. 8B, a well contact structure 267 is formed, which completely fills in the recess regions RA1 to RA3 shown in FIG. 8A and the third through part TH3. The well contact structure 267 is in direct contact with upper and bottom surfaces of the channel layer 143, which are exposed through the recess regions RA1 to RA3 shown in FIG. 8A, and extends between the channel layer 143 and the well structure WE. Also, the well contact structure 267 is in direct contact with the upper surface of the well structure WE. The process of forming the well contact structure 267 may use the process described in FIG. 7E.

Referring to FIG. 8C, an inter-well-source insulating layer 169 is formed through the same process as described in FIG. 7F, and a second source contact pattern S2 is formed through the same process as described in FIG. 7G.

Figure 9A:
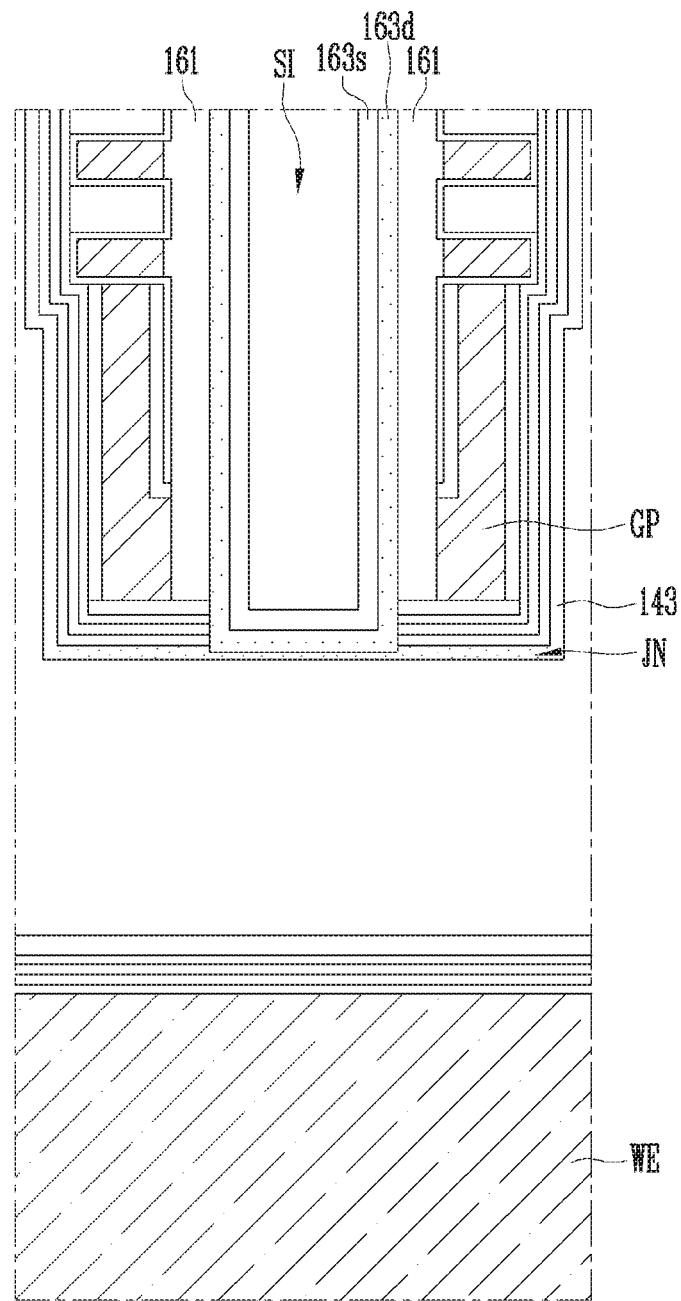
FIGS. 9A and 9B show sectional views illustrating an embodiment of subsequent processes continued after the process shown in FIG. 6N.
Figure 9B:
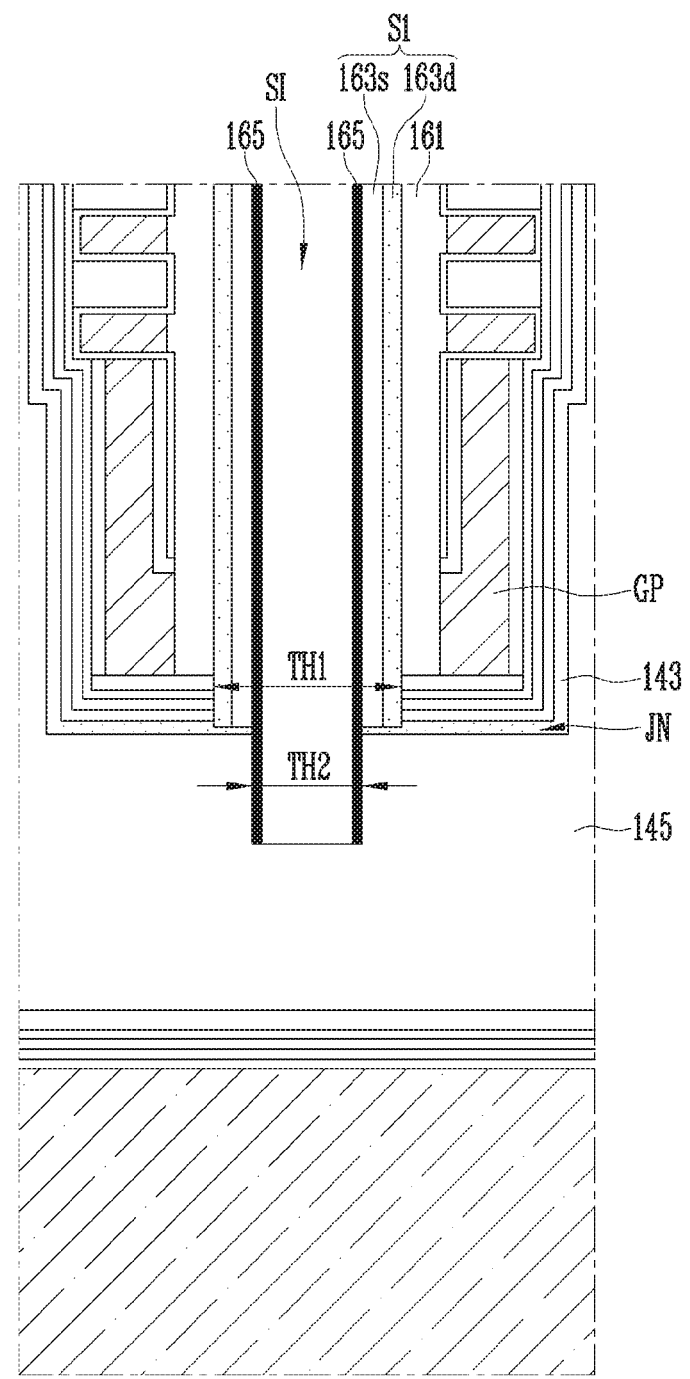

FIGS. 9A and 9B show sectional views illustrating an embodiment of the subsequent processes continued after a process shown in FIG. 6N. The sectional views shown in FIGS. 9A and 9B correspond to region C shown in FIG. 6N. The processes shown in FIGS. 9A and 9B may be used to manufacture the semiconductor device shown in FIG. 3A.

After the processes described in FIGS. 6A to 6N are sequentially performed, the processes described in FIGS. 7A and 7B may be performed so as to manufacture the semiconductor device shown in FIG. 3A. Subsequently, a process shown in FIG. 9A is performed.

Referring to FIG. 9A, the doped semiconductor layer 163 shown in FIG. 7B is changed into a metal silicide layer 163s by silicidizing a partial thickness of the doped semiconductor layer 163 from a surface of the doped semiconductor layer 163. A doped semiconductor layer 163d that remains without being changed into the metal silicide layer 163s may remain on the bottom of the metal silicide layer 163s. The doped semiconductor layer 163d may extend between the metal silicide layer 163s and the spacer insulating layers 161 and between the channel layer 143 and the metal silicide layer 163s.

The silicidizing process may include a process of depositing a metal layer and an annealing process of inducing a reaction between the metal layer and a doped semiconductor layer formed of silicon. A dopant of the second conductivity type in the doped silicon layer may be diffused into the channel layer 143 through the annealing process performed while the silicidizing process is being performed. Accordingly, a source junction JN is formed in the channel layer 143.

The metal layer for the silicidizing process may include various metal layers such as nickel and tungsten. The metal silicide layer 163s formed through the silicidizing process may include nickel silicide, tungsten silicide, etc.

Referring to FIG. 9B, a second through part TH2 may be formed by etching a portion of the metal silicide layer 163s and a portion of the doped semiconductor layer 163d through the slit SI and the first through part TH1 so as to separate each of the doped semiconductor layer 163d and the metal silicide layer 163s into first source contact patterns S1.

Each of the source contact patterns S1 includes the doped semiconductor layer 163d and the metal silicide layer 163S. Each of the source contact patterns S1 is in contact with the channel layer 143 defining the bottom surface of the first through part TH1 to extend on each of the sidewalls of the spacer insulating layers 161.

The metal silicide layer 163S has a resistance lower than that of the doped semiconductor layer 163d, and hence the resistance of the first source contact patterns S1 can be decreased.

The second through part TH2 penetrates the channel layer 143 and extends to the inside of the gap fill insulating layer 145 as described in FIG. 7C.

Subsequently, fifth protective layers 165 extending to cover the sidewalls of the second through part TH2 and the sidewalls of the first source contact patterns S1 are formed using the same process as described in FIG. 7C. Subsequent processes continued after the process shown in FIG. 7C are the same as described in FIGS. 7D to 7G.

The processes shown in FIG. 6A to 6N may be sequentially performed so as to manufacture the semiconductor device shown in FIG. 3B. Subsequently, the processes shown in FIGS. 7A and 7B may be sequentially performed. Subsequently, the processes shown in FIGS. 9A and 9B may be sequentially performed. Subsequently, the processes described in FIGS. 8A to 8C may be sequentially performed.

Figure 10:
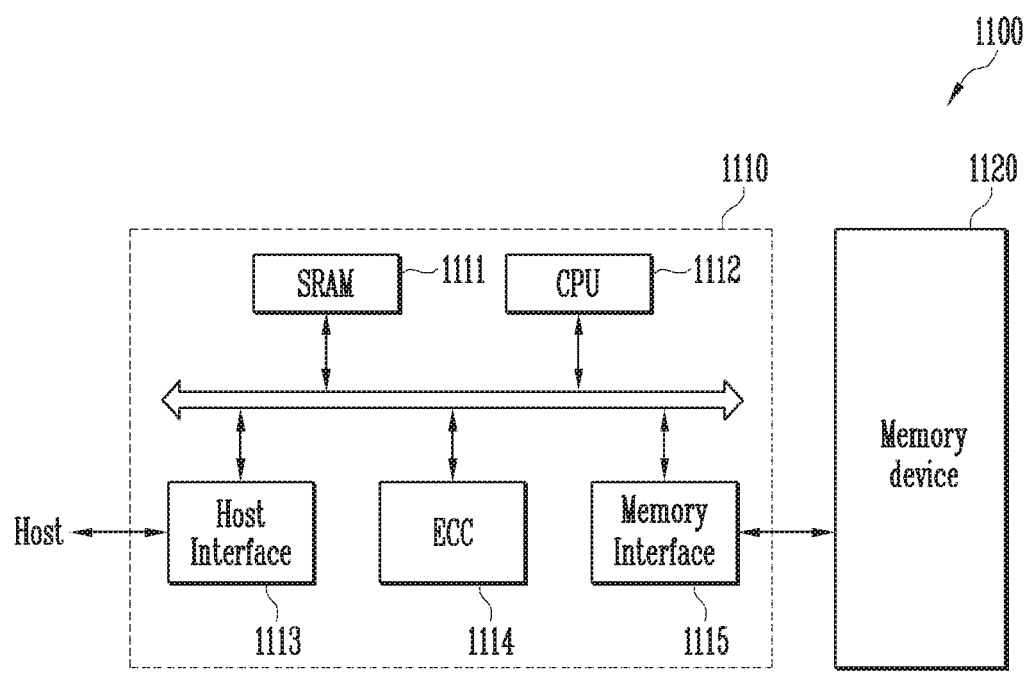
FIG. 10 shows a block diagram illustrating a configuration of a memory system, according to an embodiment of the present disclosure.

FIG. 10 shows a block diagram illustrating a configuration of a memory system according to an embodiment of the present disclosure.

Referring to FIG. 10, the memory system 1100 according to the embodiment of the present disclosure includes a memory device 1120 and a memory controller 1110.

The memory device 1120 may include at least one of the structures shown in FIGS. 1A, 1B, 2A, 2B, 3A, and 3B. The memory device 1120 may be a multi-chip package configured with a plurality of flash memory chips.

The memory controller 1110 is configured to control the memory device 1120, and may include a static random access memory (SRAM) 1111, a CPU 1112, a host interface 1113, an error correction code (ECC) 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 11:
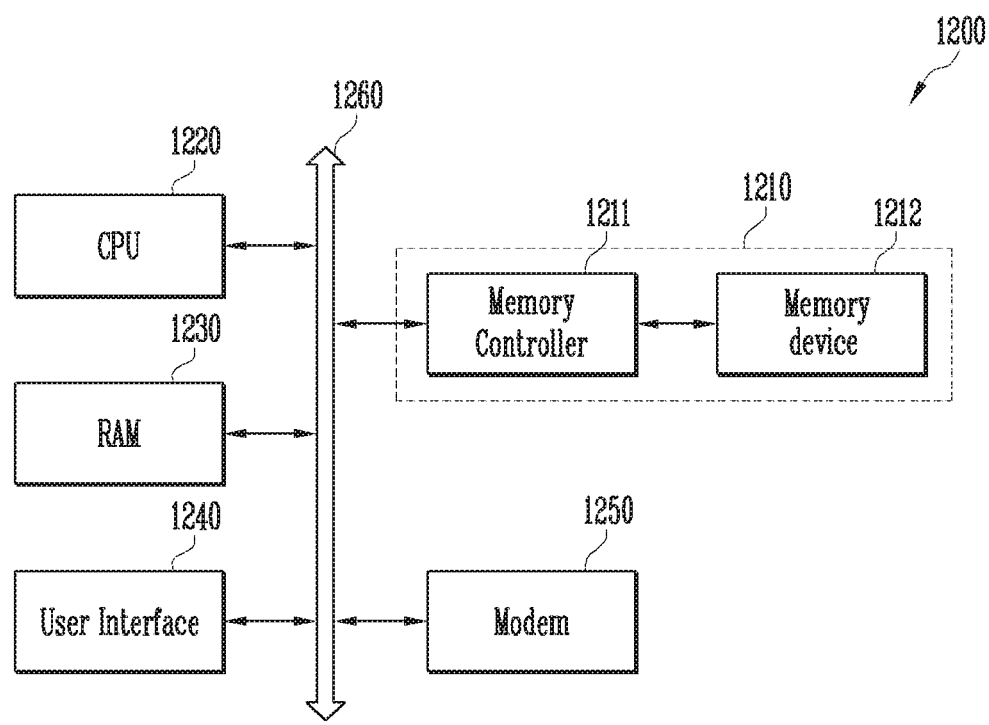
FIG. 11 shows a block diagram illustrating a configuration of a computing system, according to an embodiment of the present disclosure.

FIG. 11 shows a block diagram illustrating a configuration of a computing system according to an embodiment of the present disclosure.

Referring to FIG. 11, the computing system 1200 according to the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210, as described with reference to FIG. 10, may be configured with a memory device 1212 and a memory controller 1211.

According to the present disclosure, a portion of the channel pattern extending to the inside of the space between the well structure and the gate stack structure is in contact with the bottom surface of the source contact structure, so that the contact area between the source contact structure and the channel pattern can be increased. Accordingly, the operational reliability of the three-dimensional semiconductor device can be improved.

The above-described exemplary embodiments are merely for the purpose of understanding the technical spirit of the present disclosure and the scope of the present disclosure should not be limited to the above-described exemplary embodiments. It will be obvious to those skilled in the art to which the present disclosure pertains that other modifications based on the technical spirit of the present disclosure may be made in addition to the above-described exemplary embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

What is claimed is:

1. A semiconductor device comprising:
   a well structure;
   a gate stack structure spaced apart from the well structure, the gate stack structure being disposed over the well structure;
   a source gate pattern disposed between the gate stack structure and the well structure, wherein the source gate pattern is spaced apart from the well structure;
   a source contact structure facing a sidewall of the gate stack structure; and
   a channel pattern comprising:
      pillar parts penetrating the gate stack structure;
      a first connecting part extending along a bottom surface of the gate stack structure from the pillar parts; and
      a second connecting part extending from the first connecting part to contact a first surface of the source contact structure facing the well structure,
   wherein the gate stack structure comprises:
      a side region adjacent to the source contact structure, wherein the side region overlaps the source gate pattern; and
      a center region extending from the side region, wherein the center region is penetrated by the pillar parts, and wherein the center region does not overlap the source gate pattern.

2. The semiconductor device of claim 1, wherein the well structure comprises a doped semiconductor layer including a dopant of a first conductivity type, and
   the source contact structure includes a doped semiconductor layer including a dopant of a second conductivity type different from the first conductivity type.

3. The semiconductor device of claim 1, wherein the gate stack structure includes alternately stacked horizontal conductive patterns and interlayer insulating layers.

4. The semiconductor device of claim 1, further comprising a spacer insulating layer disposed between the gate stack structure and the source contact structure.

5. The semiconductor device of claim 1, wherein the second connecting part of the channel pattern extends toward the first surface from the first connecting part and is disposed on a surface of the source gate pattern.

6. The semiconductor device of claim 1, wherein the source contact structure protrudes farther toward the well structure than the source gate pattern.

7. The semiconductor device of claim 1, wherein the source contact structure comprises:
   a first source contact pattern extending upward from the first surface to face the sidewall of the gate stack structure; and
   a second source contact pattern formed on a sidewall of the first source contact pattern, the second source contact pattern extending beyond the first surface toward the well structure.

8. The semiconductor device of claim 7, wherein the first source contact pattern is formed of a doped semiconductor layer comprising a sidewall that forms a common surface with the second source contact pattern.

9. The semiconductor device of claim 7, wherein the first source contact pattern comprises:
   a doped silicon layer facing the sidewall of the gate stack structure, the doped silicon layer including an n-type dopant; and
   a metal silicide layer disposed between the doped silicon layer and the second source contact pattern.

10. The semiconductor device of claim 7, wherein the second source contact pattern comprises:
    a metal layer protruding farther toward the well structure than the first source contact pattern; and
    a barrier metal layer extending along a surface of the metal layer.

11. The semiconductor device of claim 1, wherein a source junction comprising a distributed n-type dopant is formed in the second connecting part of the channel pattern adjacent to the source contact structure.

12. The semiconductor device of claim 1, further comprising:
    an insulating pattern filling in a central region of each of the pillar parts, the insulating pattern extending to a space between the well structure and the gate stack structure; and
    supports penetrating the insulating pattern under the gate stack structure,
    wherein the channel pattern further comprises a third connecting part extending along sidewalls of the supports from the first connecting part and a fourth connecting part extending along an upper surface of the well structure from the third connecting part.

13. The semiconductor device of claim 12, further comprising:
    a well contact structure disposed between the source contact structure and the well structure, the well contact structure being in contact with the well structure and the fourth connecting part of the channel pattern; and
    an inter-well-source insulating layer disposed between the well contact structure and the source contact structure,
    wherein the well contact structure comprises a vertical part facing the inter-well-source insulating layer from the well structure.

14. The semiconductor device of claim 12, further comprising:
    a well contact structure disposed between the source contact structure and the well structure, the well contact structure being in contact with the well structure and the fourth connecting part of the channel pattern; and
    an inter-well-source insulating layer disposed between the well contact structure and the source contact structure,
    wherein the well contact structure further comprises:
      a vertical part facing the inter-well-source insulating layer from the well structure;
      a first horizontal part extending, from the vertical part, between the fourth connecting part of the channel pattern and the insulating pattern;
      a second horizontal part extending, from the vertical part, parallel to the first horizontal part with the fourth connecting part interposed between the first and second horizontal parts; and
      a third horizontal part extending from the vertical part to be in contact with the upper surface of the well structure and be in parallel to the second horizontal part.

15. The semiconductor device of claim 14, further comprising a multi-layered memory pattern extending along an outer surface of the channel pattern,
    wherein the multi-layered memory pattern includes:
      a tunnel insulating layer surrounding the channel pattern;
      a data storage layer surrounding the channel pattern with the tunnel insulating layer interposed between the channel pattern and the data storage layer; and
      a blocking insulating layer surrounding the channel pattern with the tunnel insulating layer and the data storage layer interposed between the channel pattern and the blocking insulating layer, and
    wherein the data storage layer protrudes, between the second horizontal part and the third horizontal part, farther toward the vertical part than the tunnel insulating layer and the blocking insulating layer to be in contact with the vertical part.

16. A semiconductor device comprising:
    a well structure;
    a gate stack structure spaced apart from the well structure, the gate stack structure being disposed over the well structure;
    a source contact structure facing a sidewall of the gate stack structure;
    a channel pattern comprising:
      pillar parts penetrating the gate stack structure;
      a first connecting part extending along a bottom surface of the gate stack structure from the pillar parts; and
      a second connecting part extending from the first connecting part to contact a first surface of the source contact structure facing the well structure;
    an insulating pattern filling in a central region of each of the pillar parts, the insulating pattern extending to a space between the well structure and the gate stack structure; and
    supports penetrating the insulating pattern under the gate stack structure,
    wherein the channel pattern further comprises a third connecting part extending along sidewalls of the supports from the first connecting part and a fourth connecting part extending along an upper surface of the well structure from the third connecting part.

17. A semiconductor device comprising:
    a well structure;
    a gate stack structure spaced apart from the well structure, the gate stack structure being disposed over the well structure;
    a source gate pattern disposed between the gate stack structure and the well structure, wherein the source gate pattern is spaced apart from the well structure;
    a source contact structure facing a sidewall of the gate stack structure; and a channel pattern comprising:
  pillar parts penetrating the gate stack structure;
  a first connecting part extending along a bottom surface of the gate stack structure from the pillar parts; and
  a second connecting part extending from the first connecting part to contact a first surface of the source contact structure,
wherein the gate stack structure comprises:
  a side region adjacent to the source contact structure, wherein the side region overlaps the source gate pattern; and
  a center region extending from the side region, wherein the center region is penetrated by the pillar parts, and wherein the center region does not overlap the source gate pattern.

* * * * *